(12) United States Patent
Obayashi et al.

(10) Patent No.: US 12,292,485 B2
(45) Date of Patent: May 6, 2025

(54) MAGNETIC DETECTION SYSTEM

(71) Applicant: DENSO CORPORATION, Kariya (JP)

(72) Inventors: Kazuyoshi Obayashi, Kariya (JP); Nobuhisa Yamaguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 134 days.

(21) Appl. No.: 18/214,702

(22) Filed: Jun. 27, 2023

(65) Prior Publication Data
US 2023/0341478 A1    Oct. 26, 2023

Related U.S. Application Data

(63) Continuation of application No. PCT/JP2022/007344, filed on Feb. 22, 2022.

(30) Foreign Application Priority Data

Mar. 19, 2021    (JP) .................. 2021-045315

(51) Int. Cl.
*G01R 33/00*    (2006.01)
(52) U.S. Cl.
CPC .................. *G01R 33/0017* (2013.01)
(58) Field of Classification Search
CPC .. G01R 33/0017; G01R 33/028; G01R 33/02; Y02T 10/70; Y02T 10/7072; Y02T 90/12; Y02T 90/14; G05D 1/02; H02J 50/10; H02J 50/90
See application file for complete search history.

(56) References Cited

U.S. PATENT DOCUMENTS

| | | | |
|---|---|---|---|
| 2006/0038561 A1 | 2/2006 | Honkura et al. | |
| 2016/0197487 A1* | 7/2016 | Koizumi | B60L 53/126 307/104 |
| 2017/0326992 A1* | 11/2017 | Budhia | H02J 50/10 |
| 2018/0102676 A1* | 4/2018 | Iwamoto | H02J 7/0047 |
| 2019/0199133 A1* | 6/2019 | Yuasa | H01F 38/14 |
| 2021/0006098 A1* | 1/2021 | Ichikawa | H01F 38/14 |

FOREIGN PATENT DOCUMENTS

JP    2010-33434 A    2/2010

* cited by examiner

*Primary Examiner* — Alvaro E Fortich
(74) *Attorney, Agent, or Firm* — Oliff PLC

(57) ABSTRACT

A magnetic detection system is provided which is usable in a movable body including a power receiving system that receives power from a power transmission system by electromagnetic induction. The magnetic detection system includes at least one magnetic flux measuring unit that detects a magnetic flux including a magnetic source magnetic flux from a magnetic source disposed on the ground, and a signal processing unit that suppresses influence of a magnetic flux generated from the power receiving system on the magnetic flux measured by the magnetic flux sensor unit, to detect the magnetic source magnetic flux.

9 Claims, 28 Drawing Sheets

MAGNETIC DETECTION SYSTEM

CROSS-REFERENCE TO RELATED APPLICATION

The present application is based on and claims the benefit of priority from earlier Japanese Patent Application No. 2021-045315 filed on Mar. 19, 2021, the description of which is incorporated herein by reference.

BACKGROUND

Technical Field

The present disclosure relates to a magnetic detection system.

Related Art

A system is disclosed which, in order to perform drive assist for vehicles or the like, lays magnetic markers in roads and detects magnetic change by a magnetic sensor such as an MI element on the vehicle side to detect a displacement between positions of the vehicle in the width direction.

SUMMARY

An aspect of the present disclosure provides a magnetic detection system that is usable in a movable body including a power receiving system that receives power from a power transmission system by electromagnetic induction, the magnetic detection system including: at least one magnetic flux measuring unit that detects a magnetic flux including a magnetic source magnetic flux from a magnetic source disposed on the ground; and a signal processing unit that suppresses influence of a magnetic flux generated from the power receiving system on the magnetic flux measured by the magnetic flux sensor unit, to detect the magnetic source magnetic flux.

DETAILED DESCRIPTION OF THE PREFERRED EMBODIMENTS

JP-A-2010-33434 discloses a system that, in order to perform drive assist for vehicles or the like, provides magnetic markers in roads and detects magnetic change by a magnetic sensor such as an MI element on the vehicle side to detect a displacement between positions of the vehicle in the width direction.

JP-A-2010-33434 uses a magnetic sensor and detects a magnetic flux of magnetic markers. However, JP-A-2010-33434 has a problem that when a wireless charging system operates, a magnetic flux is generated from a transmission coil of the wireless charging system, whereby since the magnetic flux is larger than the magnetic flux of the magnetic markers, the magnetic sensor cannot detect the magnetic markers in the roads.

First Embodiment

Figure 1:
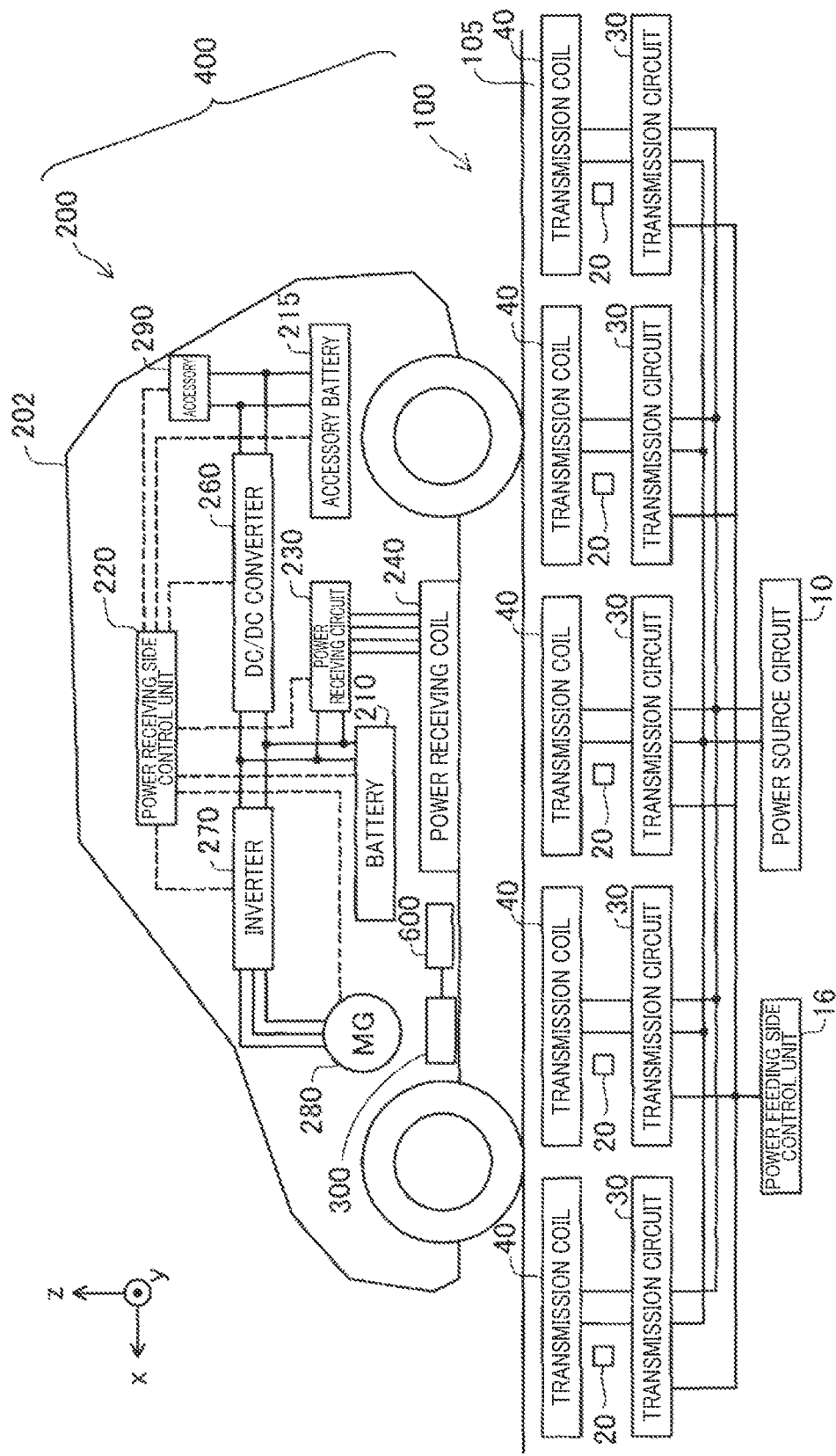
FIG. 1 is an explanatory drawing illustrating a traveling feeding system.
Figure 2:
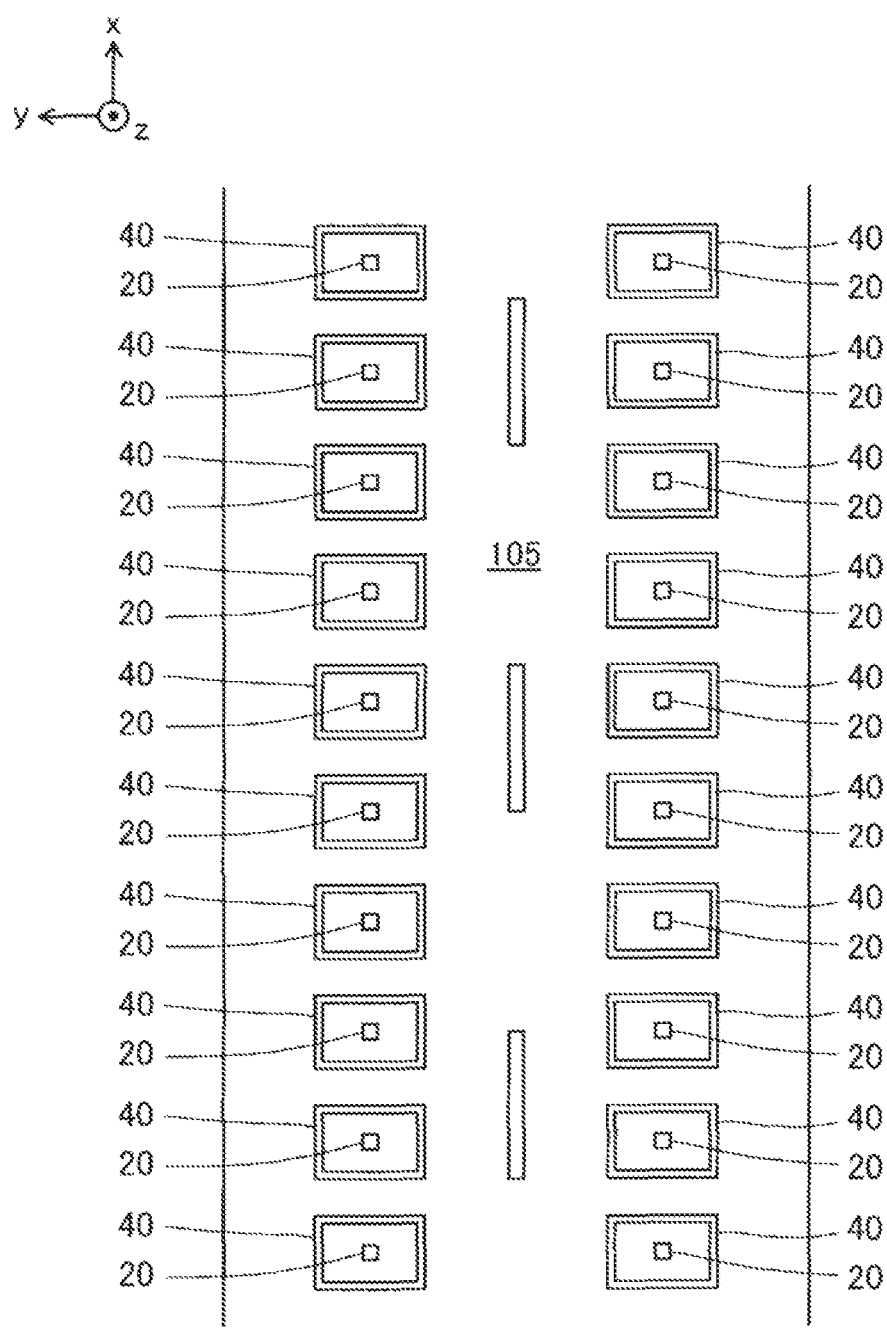
FIG. 2 is a plan view illustrating power transmission coils and magnetic sources buried in a road.

FIG. 1 is an explanatory drawing illustrating a traveling power feeding system 400. FIG. 2 is a plan view illustrating power transmission coils 40 and magnetic sources 20 buried in a road 105. The traveling power feeding system 400 includes a power transmission system 100 on the road 105 side and a power receiving system 200 on a vehicle 202 (which is a movable body) side. The traveling power feeding system 400 can feed power from the power transmission system 100 to the vehicle 202 while the vehicle 202 is traveling. The vehicle 202 is, for example, an electric vehicle or a hybrid vehicle. In FIG. 1, the x-axis direction indicates a traveling direction of the vehicle 202, that is, a longitudinal direction, the y-axis direction indicates a width direction of the vehicle 202, that is, a horizontal direction with respect to the traveling direction of the vehicle 202, and the z-axis direction indicates a vertical direction, that is, a height direction.

The power transmission system 100 on the road 105 side includes a plurality of coils 40 for power transmission arranged along the road 105 (hereinafter, also referred to as "transmission coil 40"), a plurality of transmission circuits 30 that supply AC voltage to the plurality of transmission coils 40, a plurality of magnetic sources 20, a power source circuit 10 that supplies DC voltage to the plurality of transmission circuits 30, and a power feeding side control unit 16.

The plurality of transmission coils 40 are arranged along the x direction at a predetermined depth from the surface of the road 105. The magnetic sources 20 are buried inside the transmission coils 40 of the road 105. In the present embodiment, the magnetic source 20 is a point-like magnetic source, and is formed of, for example, a magnet. In the example illustrated in FIG. 2, the magnetic source 20 is disposed inside the transmission coil 40. However, the magnetic source 20 may be disposed at a position other than the inside of the transmission coils 40 if it is disposed along the road 105. One magnetic source 20 may not be disposed for one transmission coil 40 but may be disposed for a plurality of coils. The transmission circuit 30 converts DC voltage supplied from the power source circuit 10 to high-frequency AC voltage to apply the AC voltage to the transmission coils 40 and includes an inverter circuit and a resonant circuit, which are not shown. In addition to the inverter circuit and the resonant circuit, a filter circuit may be included. The power source circuit 10 supplies DC power to the transmission circuit 30. For example, the power source circuit 10 is configured as an AC/DC converter circuit that rectifies AC current supplied from a commercial power source and outputs DC current. DC current output from the power source circuit 10 may not be perfect DC current but may include a certain ripple.

The vehicle 202 includes a battery 210, an accessory battery 215, a power receiving side control unit 220, a power receiving circuit 230, a power receiving coil 240, a DC/DC converter circuit 260, an inverter circuit 270, a motor generator 280, an accessory 290, a magnetic source detection device 300, and a position detection unit 600. The power receiving coil 240 is connected to the power receiving circuit 230. Output of the power receiving circuit 230 is connected to the battery 210, the high-voltage side of the DC/DC converter circuit 260, and the inverter circuit 270. The low-voltage side of the DC/DC converter circuit 260 is connected to the accessory battery 215 and the accessory 290. The inverter circuit 270 is connected to the motor generator 280.

The power receiving coil 240 generates induced electromotive force by electromagnetic induction between the power receiving coil 240 and the transmission coil 40. The power receiving circuit 230 includes a rectifying circuit that converts AC voltage output from the power receiving coil 240 to DC voltage, a DC/DC converter circuit that converts the DC voltage generated by the rectifying circuit to voltage suited to charging the battery 210. The DC voltage output from the power receiving circuit 230 can be utilized for charging the battery 210 and driving the motor generator 280 through the inverter circuit 270. The DC voltage output from the power receiving circuit 230 is decreased by using the DC/DC converter circuit 260, whereby the DC voltage can be utilized for charging the accessory battery 215 and driving the accessory 290. A plurality of power receiving coils 240 may be provided. Providing the plurality of power receiving coils 240 can perform robust optimized design for position displacement of the vehicle 202. When a plurality of power receiving coil 240 are provided, the power receiving circuit 230 may be multi-phase. The multi-phase can integrate the power receiving circuit 230, whereby the installation space in the vehicle 202 can be decreased.

The battery 210 is a secondary battery that outputs relatively high DC voltage for driving the motor generator 280, for example, a voltage of hundreds V. The motor generator 280 operates as a three-phase AC motor and generates driving force for travel of the vehicle 202. The motor generator 280 operates as a generator when the vehicle 202 decelerates to regenerate electric power. When the motor generator 280 operates as a motor, the inverter circuit 270 converts electric power of the battery 210 to three-phase AC current, and supplies the three-phase AC current to the motor generator 280. When the motor generator 280 operates as a generator, the inverter circuit 270 converts the three-phase AC current regenerated by the motor generator 280 to DC current, and supplies the DC current to the battery 210.

The DC/DC converter circuit 260 converts the output of the battery 210 to a voltage lower than the output voltage of the battery 210, for example, 12 V and supplies the voltage to the accessory battery 215 and the accessory 290. The accessory battery 215 is a secondary battery for driving the accessory, 290 and the voltage thereof is relatively low. The accessory 290 includes peripheral devices such as various sensors, an instrument panel display, an electric power steering device, headlights, blinkers, and windshield wipers of the vehicle 202, and various accessories of the vehicle 202.

The power receiving side control unit 220 controls, in addition to the inverter circuit 270 in the vehicle 202, each unit. When being subjected to wireless charging during traveling, the power receiving side control unit 220 controls the power receiving circuit 230 to receive electric power.

The magnetic source detection device 300, which is a magnetic detection system, detects the magnetic sources 20 buried in the road 105. The position detection unit 600 receives a signal from the magnetic source detection device 300 and detects a position of the vehicle 202 with respect to the magnetic sources 20 (the road 105). When the vehicle 202 is displaced from the magnetic sources 20 and is not traveling along the road 105, the position detection unit 600 issues warning that the vehicle 202 is not traveling along the road 105 to the driver of the vehicle 202. The warning is issued by, for example, display on the instrument panel of the vehicle 202, voice, or a warning sound. The position detection unit 600 may instruct the driver of the vehicle 202 on a course in which the vehicle 202 travels along the road 105. If the vehicle 202 is an autonomous vehicle, the position detection unit 600 may inform a control unit (not shown) for autonomous driving of the position of the vehicle 202 with respect to the magnetic sources 20 (road 105) and instruct the vehicle 202 to travel along the road 105.

Figure 3:
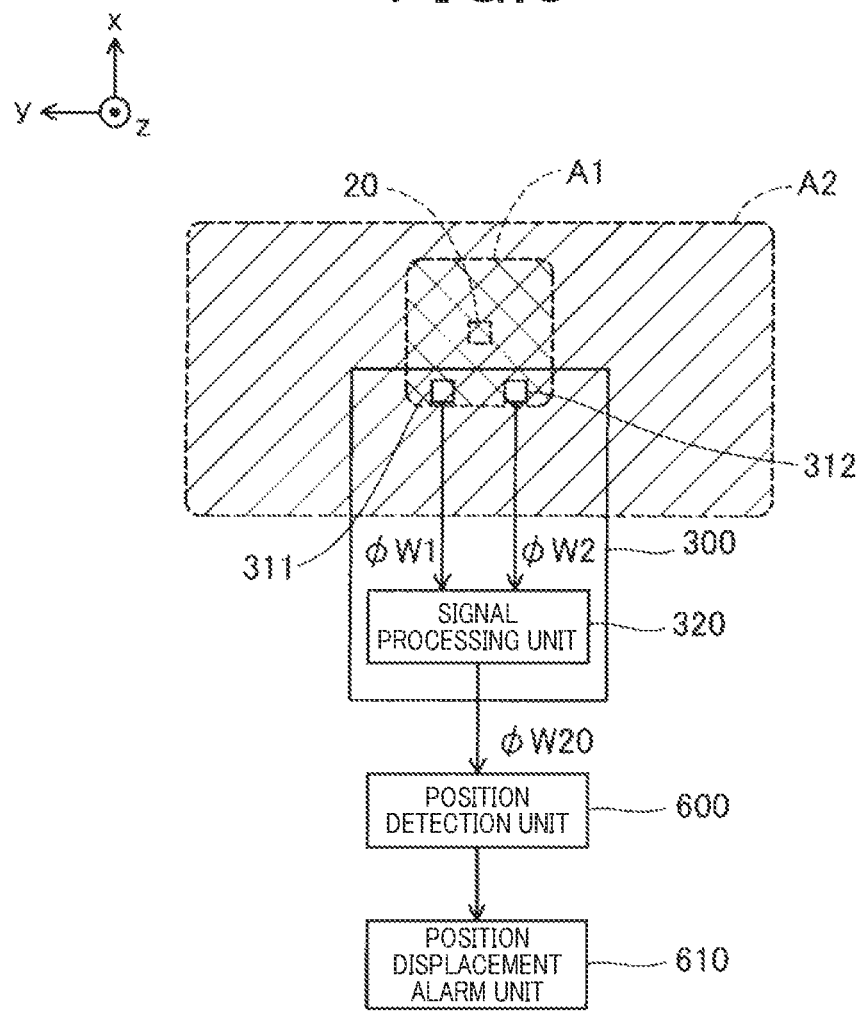
FIG. 3 is an explanatory drawing viewed from a vehicle illustrating an example of a positional relationship between an area which a magnetic source magnetic flux reaches, an area which a transmission coil magnetic flux reaches, a first magnetic flux sensor unit, and a second magnetic flux sensor unit.

FIG. 3 is an explanatory drawing viewed from the vehicle 202 illustrating an example of a positional relationship among an area A1 which a magnetic source magnetic flux $\phi$W20 of the magnetic source 20 reaches, an area A2 which a transmission coil magnetic flux $\phi$W40 of the transmission coil 40 reaches, a first magnetic flux sensor unit 311 of the magnetic source detection device 300, and a second magnetic flux sensor unit 312. The magnetic source detection device 300 includes the first magnetic flux sensor unit 311, the second magnetic flux sensor unit 312, and a signal processing unit 320. In FIG. 3, areas which a magnetic flux having a predetermined magnitude that can be detected by the first magnetic flux sensor unit 311 and the second magnetic flux sensor unit 312 are defined as areas A1, A2. The areas A1, A2 depend on sensitivity for frequencies of the sensors and the like. The magnetic source detection device 300 is installed in the vehicle 202, and the magnetic sources 20 and the power transmission coils 40 are buried in the road 105 (refer to FIG. 1, FIG. 2). Hence, when the vehicle 202 moves in +x direction, the area A1 which a magnetic flux of the magnetic source 20 reaches and the area A2 which a magnetic flux of the power transmission coil 40 reaches relatively move in −x direction with respect to the magnetic source detection device 300. In the state illustrated in FIG. 3, both the two magnetic flux sensor units 311, 312 are in both the areas A1, A2. Hence, both the two magnetic flux sensor units 311, 312 detect a magnetic flux that is obtained by combining the magnetic source magnetic flux $\phi$W20 of the magnetic source 20 with the transmission coil magnetic flux $\phi$W40 of the power transmission coils 40. The amplitude of the transmission coil magnetic flux $\phi$W40 is larger than that of the magnetic source magnetic flux $\phi$W20. As described later, since the magnetic flux sensor units 311, 312 measure a magnetic flux using a high frequency, the magnetic source magnetic flux $\phi$W20 is measured as AC current having a certain amplitude. Hence, the transmission coil magnetic flux $\phi$W40 becomes noise when the magnetic source magnetic flux $\phi$W20 is detected.

The signal processing unit 320 acquires the magnetic source magnetic flux $\phi$W20 from a first magnetic flux $\phi$W1 detected by the first magnetic flux sensor unit 311 and a second magnetic flux $\phi$W2 detected by the second magnetic flux sensor unit 312 and transmits them to the position detection unit 600. The position detection unit 600 detects a position of the vehicle 202 with respect to the width direction of the road 105 from the magnetic source magnetic flux $\phi$W20. For example, if the maximum value of the magnetic source magnetic flux $\phi$W20 has gradually decreased over a predetermined time period, the position detection unit 600 determines that the vehicle 202 is moving so as to recede from the magnetic source magnetic flux $\phi$W20 and to be displaced in the width direction of the road 105. In contrast, if the magnetic source magnetic flux $\phi$W20 has been gradually increased over a predetermined time period, the position detection unit 600 determines that the vehicle 202 is moving so as to approach the magnetic source magnetic flux $\phi$W20. When the vehicle 202 is greatly displaced in the width direction of the road 105 or the displacement has been increased due to the movement of the vehicle 202, a position displacement alarm unit 610 issues an alarm to the driver of the vehicle 202. When the vehicle 202 includes an autonomous driving function, steering may be controlled so that the magnetic source magnetic flux $\phi$W20 becomes the maximum value. In the present embodiment, the position detection unit 600 uses the maximum value of the magnetic source magnetic flux $\phi$W20. However, a representative value such as an effective value and an average value of the magnetic source magnetic flux $\phi$W20 may be used.

Figure 4:
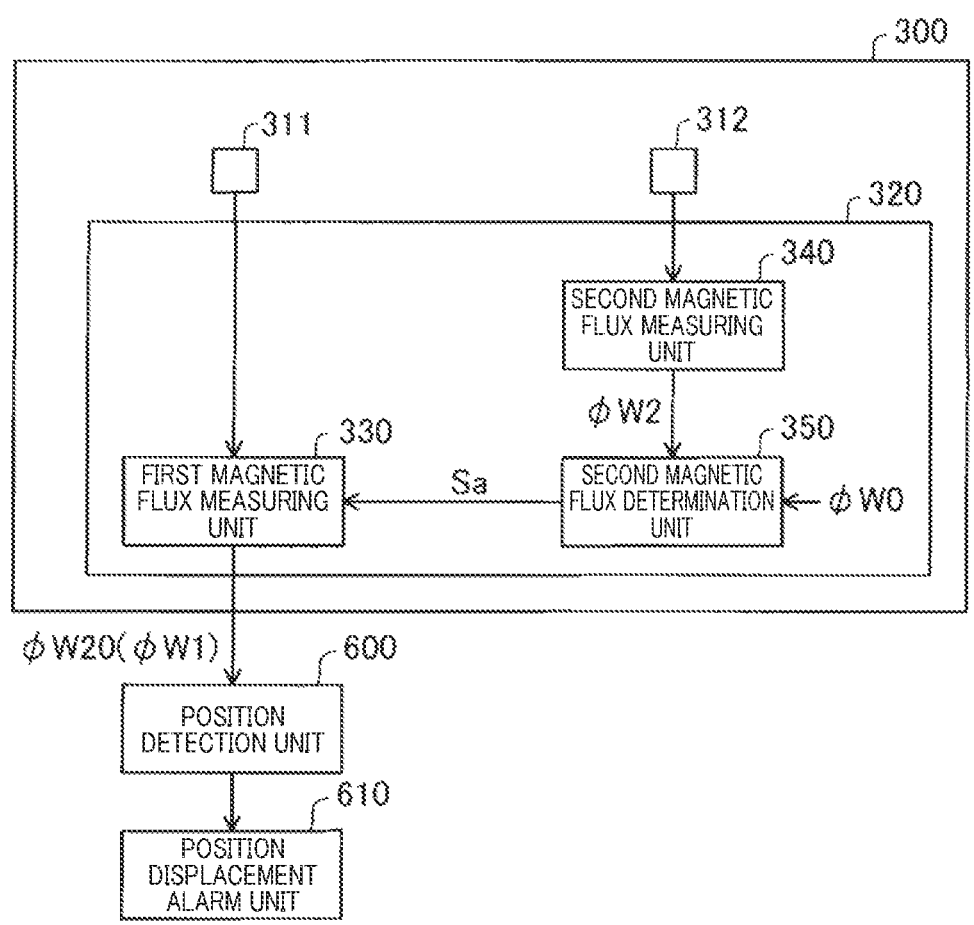
FIG. 4 is an explanatory drawing illustrating a configuration of a magnetic source detection device.

As illustrated in FIG. 4, the magnetic source detection device 300 includes the magnetic flux sensor units 311, 312 and the signal processing unit 320. The signal processing unit 320 includes a first magnetic flux measuring unit 330, a second magnetic flux measuring unit 340, and a second magnetic flux determination unit 350. The first magnetic flux measuring unit 330 measures the first magnetic flux $\phi$W1 received by the first magnetic flux sensor unit 311. However, as described later, the first magnetic flux measuring unit 330 measures the first magnetic flux $\phi$W1 only when the first magnetic flux measuring unit 330 become operable by being activated by a signal Sa. The second magnetic flux measuring unit 340 measures the second magnetic flux $\phi$W2 received by the second magnetic flux sensor unit 312. The second magnetic flux determination unit 350 transmits the signal Sa to the first magnetic flux measuring unit 330 depending on the magnitude of the second magnetic flux $\phi$W2. In the present embodiment, if the second magnetic flux $\phi$W2 is a predetermined threshold value $\phi$W0 or less, the signal Sa transmitted from the second magnetic flux determination unit 350 operates the first magnetic flux measuring unit 330. If the second magnetic flux $\phi$W2 exceeds the predetermined threshold value, the signal Sa stops the operation of the first magnetic flux measuring unit 330. In the present embodiment, the first magnetic flux $\phi$W1 measured by the first magnetic flux sensor unit 311 is a magnetic flux when the second magnetic flux $\phi$W2 is small, that is, when the transmission coil magnetic flux $\phi$W40 is small. Hence, the first magnetic flux $\phi$W1 is substantially the magnetic source magnetic flux $\phi$W20.

Figure 5:
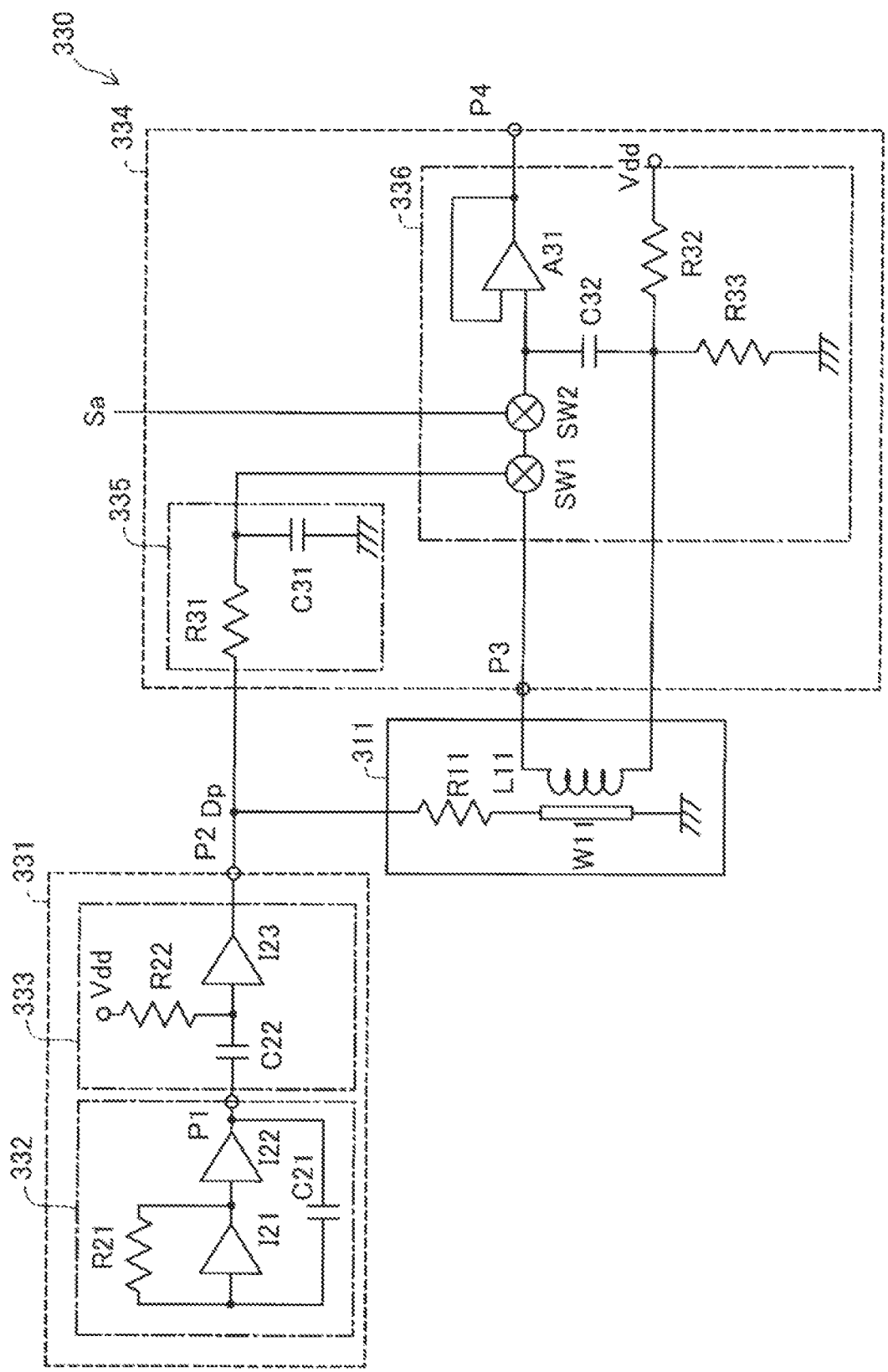
FIG. 5 is an explanatory drawing illustrating configurations of a magnetic flux sensor unit and a first magnetic flux measuring unit.

FIG. 5 is an explanatory drawing illustrating configurations of the magnetic sensor unit 311 and the first magnetic flux measuring unit 330. The first magnetic flux measuring unit 330 includes a pulse generation circuit 331 and a sample and hold circuit 334. The pulse generation circuit 331 includes a multivibrator circuit 332 and a waveform shaping circuit 333.

The multivibrator circuit 332 includes a first invertor I21, a second invertor I22, a resistor R1, and a capacitor C21. An output of the first invertor I21 is connected to an input of the second invertor I22, and is input to the first invertor I21 through a resistor R21. An output of the second invertor I22 is connected to the capacitor C21 and the other terminal of the capacitor C21 is connected to an input of the first invertor I21. The multivibrator circuit 332 generates, for example, pulses at several MHz. Changing driving currents of the first invertor I21 and the second invertor I22, capacity of the capacitor C21, and an electric resistance value of the resistor R21 can make a frequency of pulses, which are generated by the multivibrator circuit 332, a desired frequency.

The waveform shaping circuit 333 includes a capacitor C22, a resistor R22, and an inverter I23. One terminal of the capacitor C22 is connected to an output P1 of the multivibrator circuit 332. The other terminal of the capacitor C22 is pulled up to a power source Vdd by the resistor R22. The other terminal of the capacitor C22 is input to the invertor I23. The invertor I23 outputs pulses, which have been subjected to waveform shaping, to an output terminal P2 as detection pulses Dp. Providing the waveform shaping circuit 333 can suppress the multivibrator circuit 332 from being affected by a current flowing through the magnetic sensor unit 311 described later.

The magnetic sensor unit 311 includes a wire W11, a detection coil L11 wound around the wire W111, and a resistor R11 connected to the wire W111 in series. One terminal of the magnetic sensor unit 311 is connected to the output terminal P2 of the invertor I23 of the waveform shaping circuit 333, and the other terminal is grounded. In the wire W111, a pulse current flows depending on the pulse voltage of a pulse generated by the pulse generation circuit 331. At this time, in the detection coil 11, a damped oscillation voltage corresponding to the external magnetic field is induced.

The sample and hold circuit 334 includes a delay circuit 335 and a sample and hold unit 336. The delay circuit 335 includes a resistor R31 and a capacitor C31. One terminal of the resistor R31 is connected to the output terminal P2, and the other terminal is connected to one terminal of the capacitor C31. The other terminal of the capacitor C31 is grounded. The delay circuit 335 outputs a signal delayed by delay time Δt determined from an electric resistance value of the resistor R31 and a capacitance of the capacitor C31.

The sample and hold circuit 334 includes electronic switches SW1, SW2, a capacitor C32, resistors R32, R33, an operational amplifier A31 configuring a voltage follower. The capacitor C32 is connected to the detection coil L11 in parallel. Between one terminal of the detection coil L11 and one terminal of the capacitor C32, two electronic switches SW1, SW2 are connected in series. If a pulse Dp output from the pulse generation circuit 331 becomes an on state, the electronic switch SW1 becomes an on state (conductive state), and becomes an off state (non-conductive state) after the pulse Dp becomes the on state and the delay time Δ by the delay circuit 335 has passed. The delay time Δt is set to approximately ½ of the on time of the pulse Dp. Approximately ½ of the on time of the pulse Dp is a time period from the time when a current of the wire W11 is interrupted to the time when the maximum voltage of the damped oscillation voltage appears in the detection coil 11. When being turned on depending on an external signal Sa, the electronic switch SW2 connects the electronic switch SW1 and the operational amplifier A31. When being turned off, the electronic switch SW2 grounds the input of the operational amplifier A31 to discharge electric charge of the capacitor C32. The resistors R32, R33 are connected between the power source Vdd and the ground in series. The other terminal of the capacitor C32 is connected between the two resistors R32, R33. One terminal of the capacitor C32 is connected to one of the two inputs of the operational amplifier A31 configuring a voltage follower.

If the electronic switch SW2 has been turned on by the signal Sa, the sample and hold circuit 334 operates as below synchronous with output of the pulse generation circuit 331. According to on and off of the pulse Dp, which is an output of the pulse generation circuit 331, alternating current flows to the wire W1 of the magnetic flux measuring unit 311, whereby damped oscillation voltage corresponding to the external magnetic field is generated in the coil 11. In accordance with this, the switch SW1 turns on and off. During the on-period, the capacitor C32 is charged by the damped oscillation voltage generated in the coil L11. The voltage of an output terminal P4 of the operational amplifier A31 increase with the damped oscillation voltage. After the delay time by the delay circuit 335 has passed, the switch SW1 becomes an off state (non-conductive state). As a result, the charge of the capacitor C32 is held, and the voltage of the output terminal P4 of the operational amplifier A31 configuring a voltage follower is also maintained. When the electronic switch SW2 has been turned on by the signal Sa, the following operation is performed. During the time period during which the electronic switch SW1 is in an on state, inductive voltage of the detection coil L11 is applied to the capacitor C32. Next, when a pulse of the output terminal P2 falls, no current flows through the wire W11, and the electronic switch SW1 is turned off by the delay circuit 335 after a predetermined delay time Δt.

The predetermined delay time Δt is set to agree with a time period (approximately ½ of on time of the pulse Dp) from the time when a current of the wire W11 is interrupted to the time when the maximum voltage of the damped oscillation voltage appears in the detection coil 11. Hence, the electronic switch SW1 becomes off at the approximately same timing at which the maximum voltage appears. In contrast, in the capacitor C32, the voltage of the detection coil L11 immediately before the electronic switch SW1 becomes off is held. The operational amplifier A31 converts voltage of the detection coil L11 to DC voltage, whereby the voltage corresponding to the magnitude of the external magnetic field is output to the output terminal P4, and continuously holds and outputs the voltage until the voltage is updated by the next pulse.

When the electronic switch SW2 has been turned off by the signal Sa, the inductive voltage of the detection coil L11 is not applied to the capacitor C32. As a result, since input voltage of one terminal of the operational amplifier A31 becomes a certain voltage that is determined by resistance division by the resistor 32 and the resistor 33, output voltage of the operational amplifier A31 becomes zero.

Figure 6:
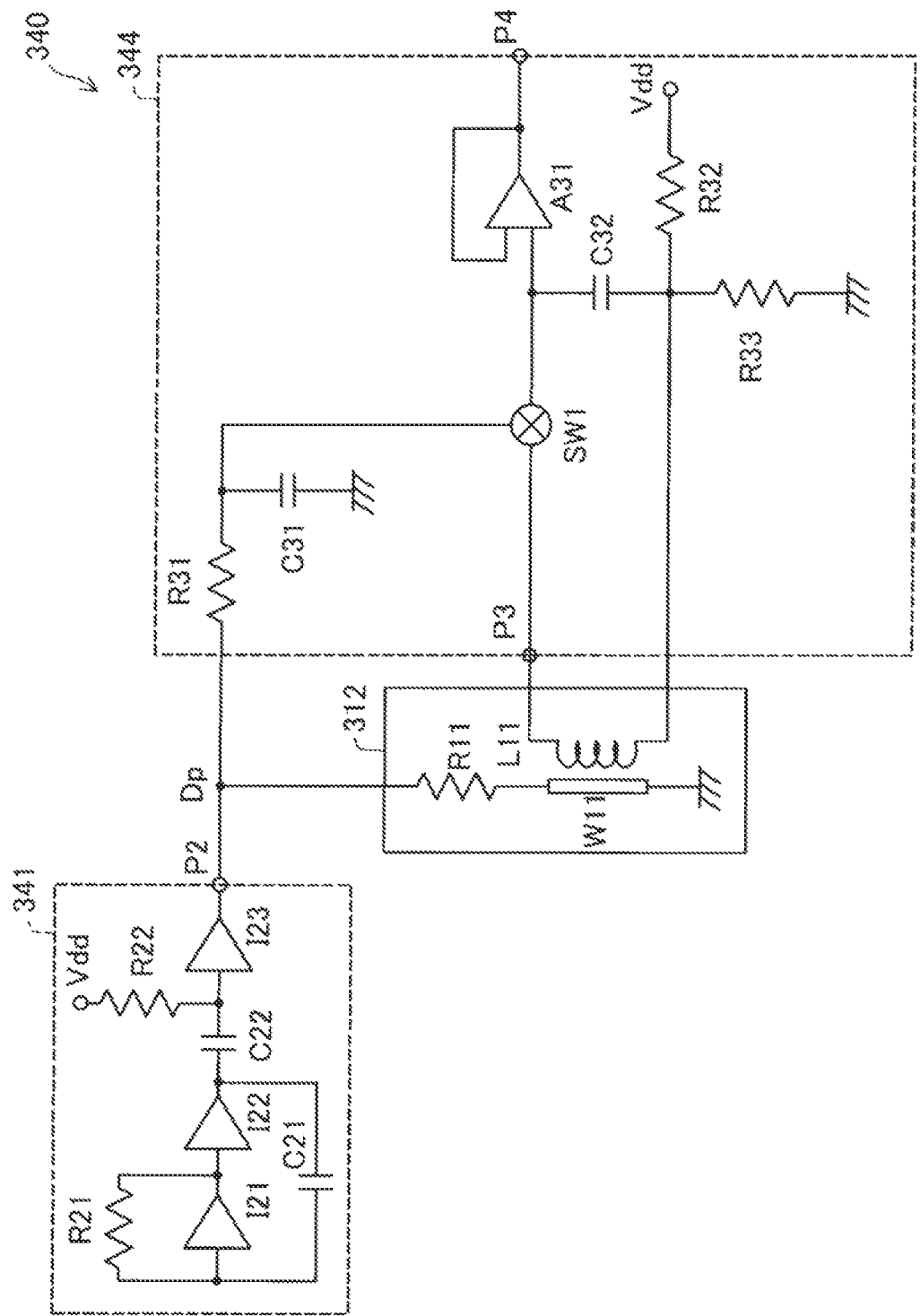
FIG. 6 is an explanatory drawing illustrating configurations of a magnetic flux sensor unit and a second magnetic flux measuring unit.

FIG. 6 is an explanatory drawing illustrating configurations of the magnetic flux sensor unit 312 and the second magnetic flux measuring unit 340. The second magnetic flux measuring unit 340 includes a pulse generation circuit 341 and a sample and hold circuit 344. Regarding the same components of the second magnetic flux measuring unit 340 as those of the first magnetic flux measuring unit 330, 10 is added to the reference numerals applied to the components of the first magnetic flux measuring unit 330 to omit redundant descriptions and simplify illustration. The second magnetic flux measuring unit 340 differs from the first magnetic flux measuring unit 330 in that the second magnetic flux measuring unit 340 does not include the electronic switch SW2 connected to the electronic switch SW1 in series. A configuration may be provided in which the electronic switch SW2 is included, and the electronic switch SW2 is always in an on state while the second magnetic flux measuring unit 340 is operating.

Figure 7:
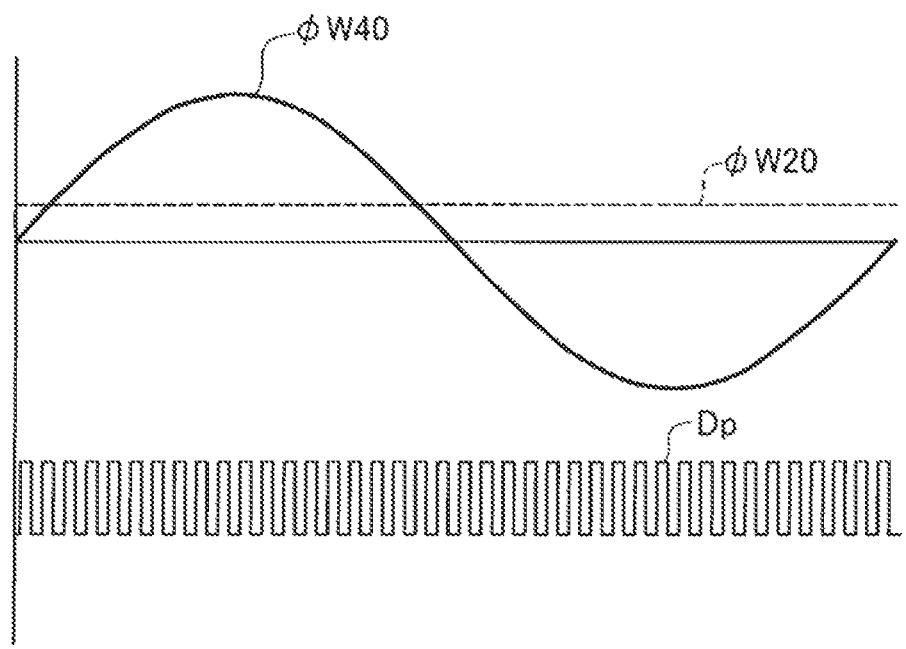
FIG. 7 is an explanatory drawing illustrating a magnetic source magnetic flux, a power transmission coil magnetic flux, and detection pulses.

FIG. 7 is an explanatory drawing illustrating a magnetic source magnetic flux φW20 generated by the magnetic sources 20, a power transmission coil magnetic flux φW40 generated by the power transmission coils 40, and the detection pulses Dp. Speed of the vehicle 202 is 120 km/h at most. Change in voltage of the power transmission coils 40 is several ten kHz. Hence, in one cycle of the voltage of the power transmission coils 40, a relative position between the power transmission coils 40 and the vehicle 202 does not almost change. Hence, even when the power transmission coils are discretely arranged as with stepping stones, the transmission coil magnetic flux φW40 measured by the first magnetic flux measuring unit 330 and the second magnetic flux measuring unit 340 becomes a sine curve having an approximately-constant peak value. The magnitude of the magnetic source magnetic flux φW20 measured by the first magnetic flux measuring unit 330 and the second magnetic flux measuring unit 340 becomes approximately constant. Although the detection pulses Dp has a frequency of several MHz, in FIG. 7, the waveform of the detection pulses Dp has a frequency of lower than several MHz for the convenience of illustration.

Figure 8:
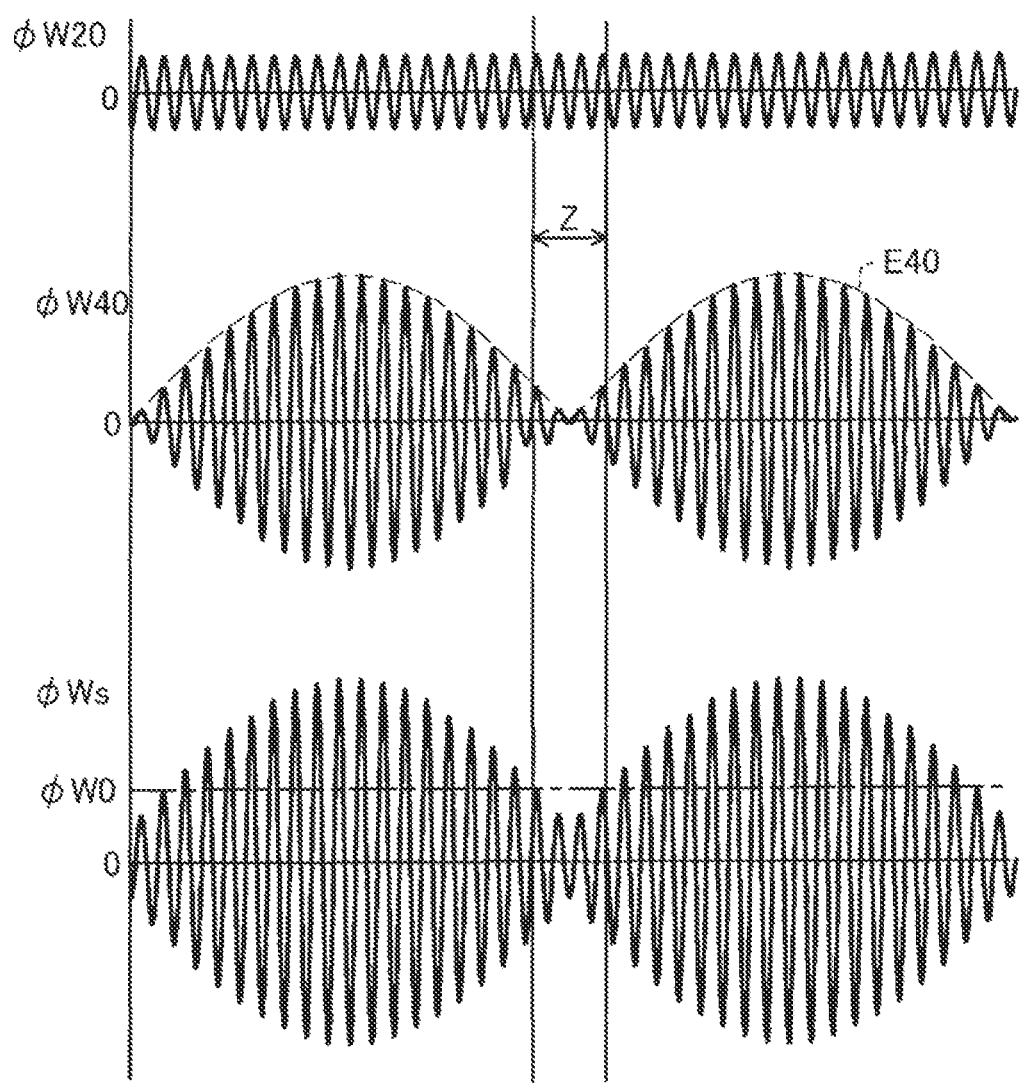
FIG. 8 is an explanatory drawing illustrating a state in which the first magnetic flux measuring unit and the second magnetic flux measuring unit measure only the magnetic source magnetic flux, only the power transmission coil magnetic flux, and a total magnetic flux of the magnetic source magnetic flux and the power transmission coil magnetic flux.

FIG. 8 is an explanatory drawing illustrating a state in which the first magnetic flux measuring unit 330 and the second magnetic flux measuring unit 340 measure only the magnetic source magnetic flux φW20, only the power transmission coil magnetic flux φW40, and a total magnetic flux φWs which is obtained by combing the magnetic source magnetic flux φW20 and the power transmission coil magnetic flux φW40. The graph of the magnetic source magnetic flux φW20 has periodic pulses having the approximately same amplitude. In the graph of the power transmission coil magnetic flux φW40, an envelope E40 connecting tops of the pulses is a sine curve. The graph of the total magnetic flux φWs is obtained by adding the graph of the magnetic source magnetic flux φW20 to the graph of the power transmission coil magnetic flux φW40. During the time period Z including points at which the envelope E40 of the graph of the power transmission coil magnetic flux φW40 causes zero-crossing, the absolute value of φWs is φW0 or less. When the vehicle 202 is traveling on the road illustrated in FIG. 2, as illustrated in FIG. 3, both of the first magnetic flux sensor unit 311 and the second magnetic flux sensor unit 312 are present at positions belonging to both of the areas A1 and A2, whereby the first magnetic flux sensor unit 311 and the second magnetic flux sensor unit 312 are exposed to the total magnetic source magnetic flux φWs from both of the magnetic sources 20 and the power transmission coils 40. Hence, in the present embodiment, the above configuration is used to suppress influence of the power transmission coil magnetic flux φW40 by the power transmission coils 40 and detects the magnetic source magnetic flux φW20 from the magnetic sources 20 as below.

In the hardware configuration illustrated in FIG. 4 to FIG. 6, the second magnetic flux sensor unit 312 is used, and the second magnetic flux measuring unit 340 detects a synthetic magnetic flux φWs as the second magnetic flux φW2, and the second magnetic flux determination unit 350 determines whether the second magnetic flux φW2 is less than a threshold value φW0. The second magnetic flux φW2 measured by the second flux measuring unit 340 is measured as an envelope curve formed by connecting positive peaks. Hence, comparing the second magnetic flux φW2 with the threshold value φW0 by using a comparator can easily determine the magnitude relation therebetween. According to the determination result, the second magnetic flux determination unit 350 outputs the signal Sa. According to the signal Sa, only during the time period Z, the first magnetic flux measuring unit 330 measures the first magnetic flux φW1. Since the power transmission coil magnetic flux φW40 generated by the power transmission coils 40 is less than a predetermined value (less than φW0), the first magnetic flux φW1 measured by the first magnetic flux measuring unit 330 becomes the magnetic source magnetic flux φW20 generated by the magnetic sources 20. As illustrated in FIG. 4, the first magnetic flux measuring unit 330 outputs a signal corresponding to the magnitude of the first magnetic flux φW1 (magnetic source magnetic flux φW20) measured during the time period Z to the position detection unit 600, to contribute to the determination by the position displacement alarm unit 610.

Figure 9:
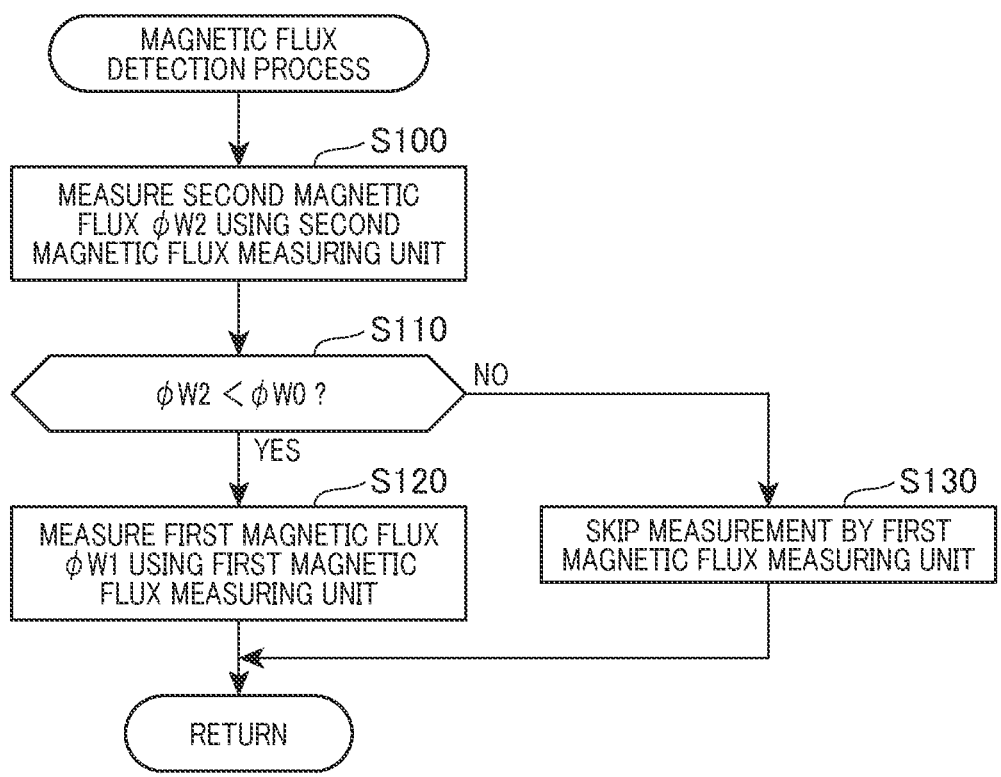
FIG. 9 is an explanatory drawing illustrating a magnetic flux detection processing step performed by a signal processing unit.

Hereinafter, a case in which a computer (CPU) measures magnetism from the magnetic sources 20 by using the hardware configuration illustrated in FIG. 4 to FIG. 6 will be described as a magnetic flux process performed by the signal processing unit 320. FIG. 9 is an explanatory drawing illustrating a magnetic flux detection processing step performed by the signal processing unit 320. In step S100, the signal processing unit 320 measures the second magnetic flux φW2 by using the second magnetic flux measuring unit 340. The second magnetic flux φW2 is a magnetic flux measured by the second magnetic flux measuring unit 340, and is only the magnetic source magnetic flux φW20, only the power transmission coil magnetic flux φW40, or a total magnetic flux φWs obtained by combing the magnetic source magnetic flux φW20 and the power transmission coil magnetic flux φW40.

In step S110, the signal processing unit 320 determines whether the absolute value |φW2| of the second magnetic flux φW2 is the value φW0 or less by using the second magnetic flux determination unit 350. If |W2| is φW0 or less, the signal processing unit 320 determines that the second magnetic flux φW2 is in a time period in which the magnetic flux generated by the transmission coil magnetic flux φW40 is approximately zero, and shifts the process to step S120 in which the signal processing unit 320 activates the signal Sa generated from the second magnetic flux determination unit 350 to operate the first magnetic flux measuring unit 330. In contrast, if |φW2| is more than the value φW0, the signal processing unit 320 determines that the second magnetic flux φW2 is the total magnetic flux φWs that is obtained by combining the magnetic source magnetic flux φW20 and the transmission coil magnetic flux φW40, and shifts the process to step S130 in which the signal processing unit 320 deactivates the signal Sa to stop the operation of the first magnetic flux measuring unit 330.

In step S120, the signal processing unit 320 uses the first magnetic flux measuring unit 330 to measure the first magnetic flux φW1. In step S120, the first magnetic flux measuring unit 330 measures any of only the magnetic source magnetic flux φW20, only the power transmission coil magnetic flux φW40, and a total magnetic flux φWs obtained by combing the magnetic source magnetic flux φW20 and the power transmission coil magnetic flux φW40 as the first magnetic flux φW1. However, since |φW2| is the value φW0 or less, the first magnetic flux measuring unit 330 measures only the magnetic source magnetic flux φW20. In contrast, in step S130, since the operation of the first magnetic flux measuring unit 330 is stopped by the signal Sa, the measurement of the first magnetic flux $\phi W1$ by the first magnetic flux measuring unit 330 is skipped.

Figure 10:
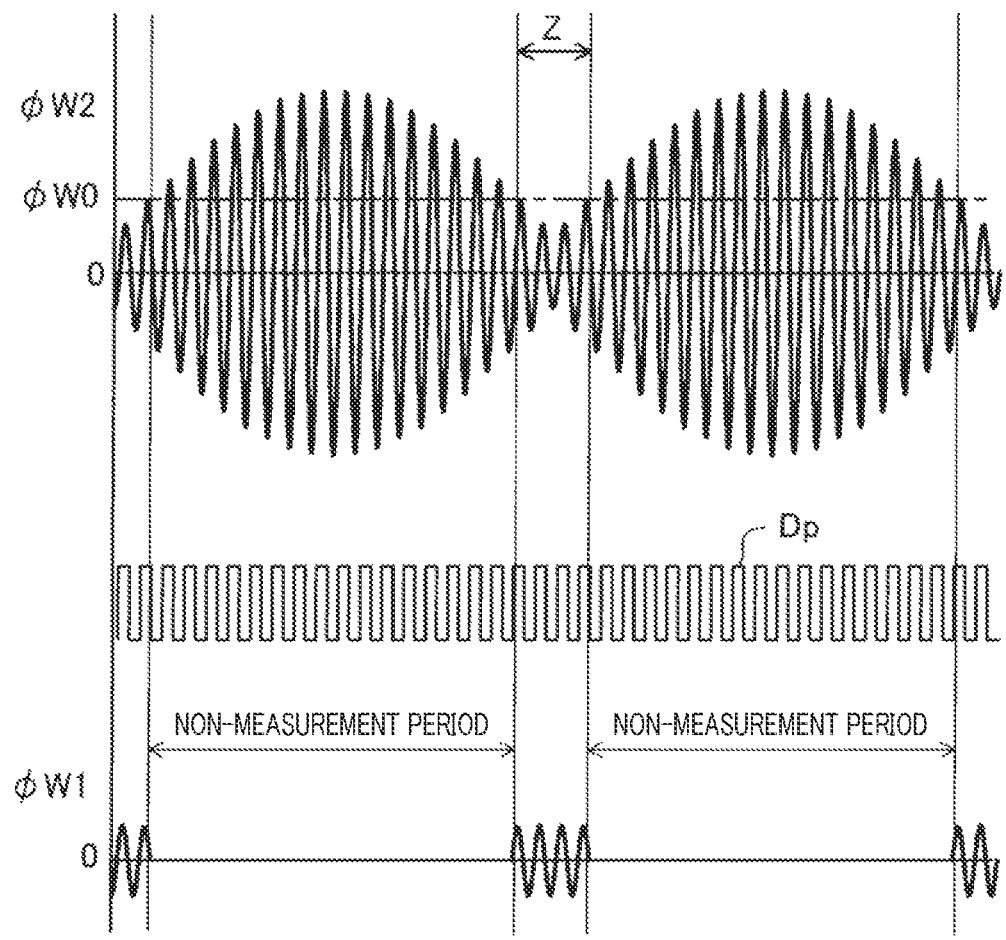
FIG. 10 is an explanatory drawing illustrating a first magnetic flux and a second magnetic flux.

FIG. 10 is an explanatory drawing illustrating the first magnetic flux $\phi W1$ and the second magnetic flux $\phi W2$. As can be understood from FIG. 10, the first magnetic flux $\phi W1$ is measured only during a time period Z in which the absolute value $|\phi W2|$ of the second magnetic flux $\phi W2$ is $\phi W0$ or less. During the time period Z, since the transmission coil magnetic flux $\phi W40$ is approximately zero, the first magnetic flux $\phi W1$ is equal to the magnetic source magnetic flux $\phi W20$ of the magnetic source 20. Hence, only the magnetic source magnetic flux $\phi W20$ can be detected and measured.

As described above, according to the first embodiment, the signal processing unit 320 operates the first magnetic flux measuring unit 330 during a time period during which the second magnetic flux $\phi W2$ measured by the second magnetic flux measuring unit 340 is less than a predetermined value, and stops the operation of the first magnetic flux measuring unit 330 during a time period during which the second magnetic flux $\phi W2$ is the predetermined value or more, whereby only the magnetic source magnetic flux $\phi W20$ from the magnetic source 20 can be detected.

Figure 11:
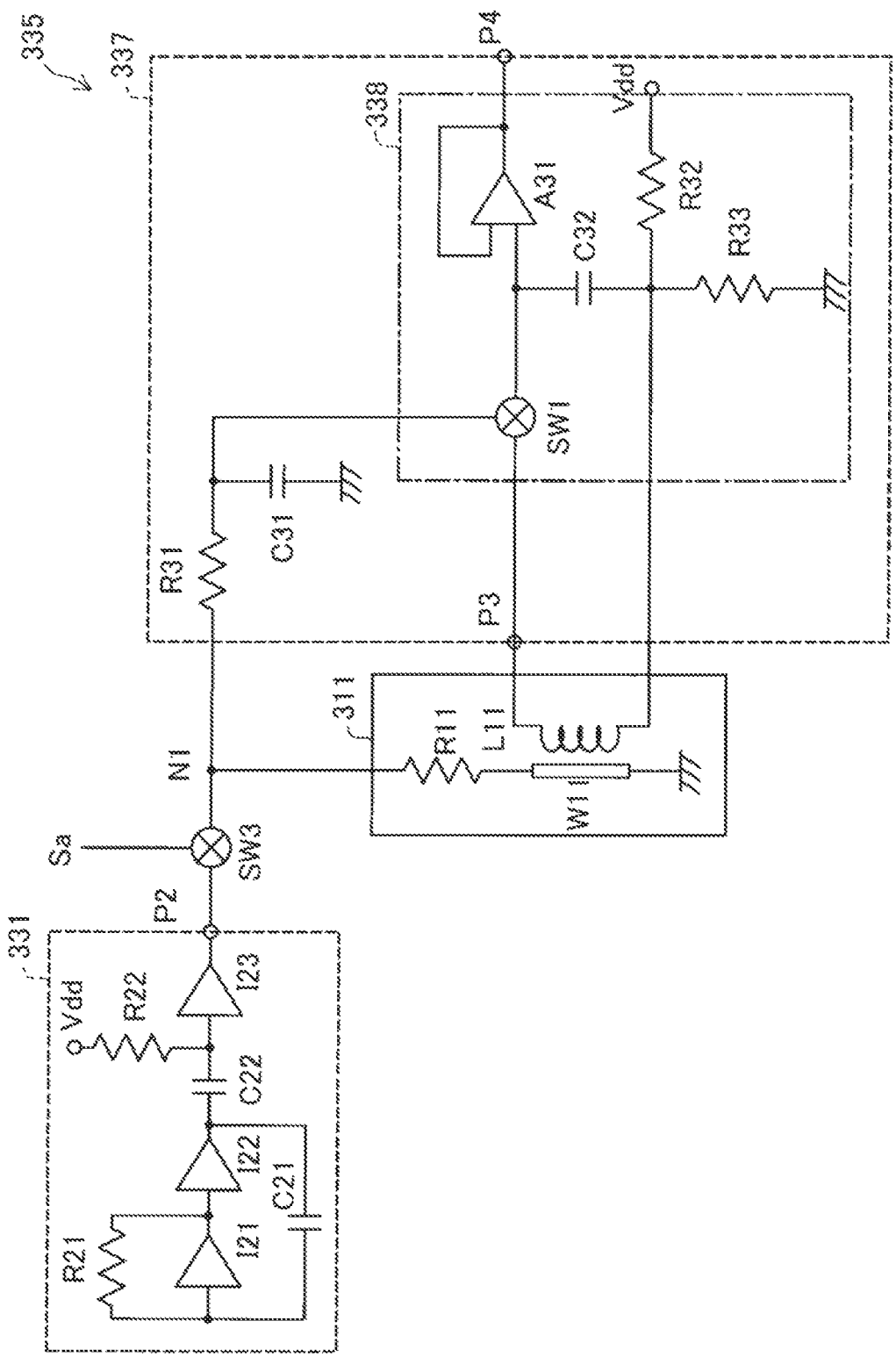
FIG. 11 is an explanatory drawing illustrating a first magnetic flux measuring unit according to a modification of a first embodiment.

FIG. 11 is an explanatory drawing illustrating the first magnetic flux measuring unit 337 according to a modification of the first embodiment. In the magnetic flux measuring unit 330 of the first embodiment, the sample and hold unit 336 includes the electronic switch SW2 connected to the electronic switch SW1 in series. However, the first magnetic flux measuring unit 337 differs from the magnetic flux measuring unit 330 in that an electronic switch SW 3 is included between the output terminal P2 of the pulse generation circuit 331 and the magnetic flux sensor unit 311. When the signal Sa is activated, the electronic switch SW 3 connects the output terminal P2 and a node N1. When the signal Sa is deactivated, the electronic switch SW 3 grounds the node N1. According to the modification, when the signal Sa is deactivated, the detection pulses Dp are not supplied to the magnetic flux sensor unit 311, the delay circuit 335, and the sample and hold unit 336. The potential of the node N1 becomes that of the ground. As a result, when the signal Sa is deactivated, output voltage of the operational amplifier A31 becomes zero. As a result, only when the signal Sa is activated, the magnetic source magnetic flux $\phi W20$ can be detected.

Second Embodiment

Figure 12:
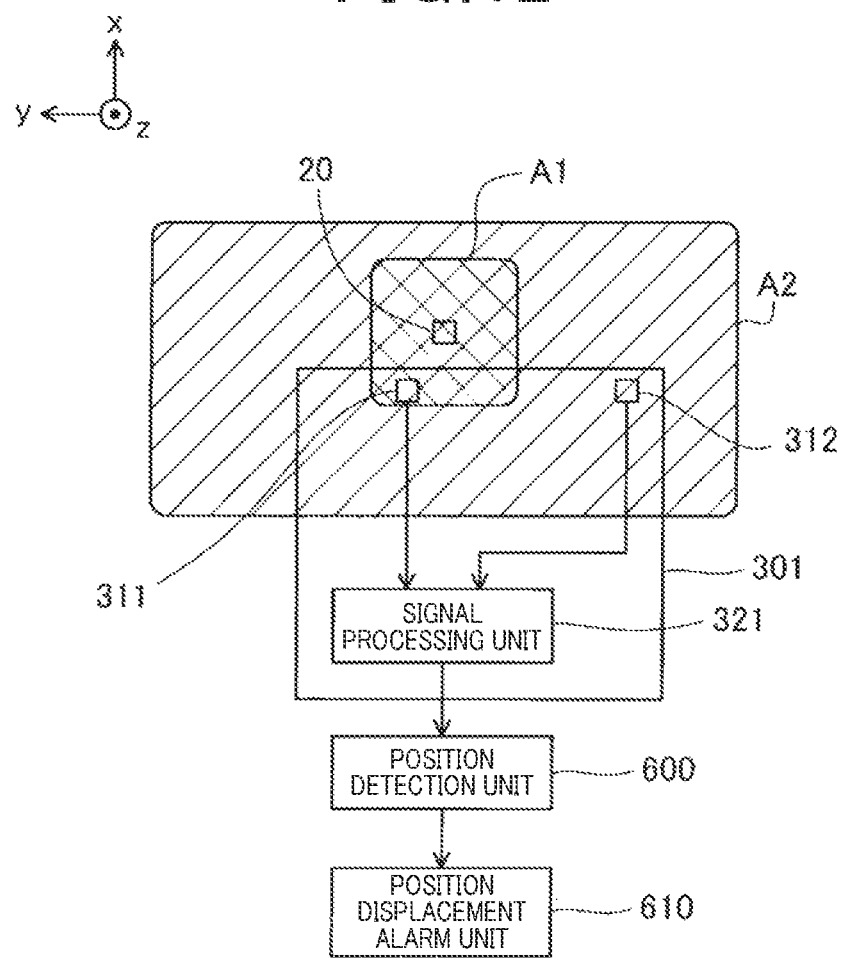
FIG. 12 is an explanatory drawing viewed from a vehicle illustrating an example of a positional relationship between an area which a magnetic source magnetic flux reaches, an area which a transmission coil magnetic flux reaches, a first magnetic flux sensor unit, and a second magnetic flux sensor unit, according to a second embodiment.

FIG. 12 is an explanatory drawing viewed from the vehicle 202 illustrating an example of a positional relationship between the area A1 which the magnetic source magnetic flux $\phi W20$ reaches, the area A2 which the transmission coil magnetic flux $\phi W40$ reaches, and the first magnetic flux sensor unit 311 and the second magnetic flux sensor unit 312 of the magnetic source detection device 301, according to the second embodiment. The second embodiment differs from the first embodiment in that the first magnetic flux sensor unit 311 and the second magnetic flux sensor unit 312 are separated at a distance more than the size of the area A1 which the magnetic source magnetic flux $\phi W20$ reaches. In the example illustrated in FIG. 12, when the first magnetic flux sensor unit 311 is in both of the area A1 and the area A2, the second magnetic flux sensor unit 312 is in the area A2 but is not in the area A1. When the vehicle 202 is traveling along the road 105, according to the positional relationship between the vehicle 202 and the magnetic source 20, the second magnetic flux sensor unit 312 may be in both of the area A1 and the area A2, and the first magnetic flux sensor unit 311 may be in the area A2 but not in the area A1.

A signal processing unit 321 acquires the magnetic source magnetic flux $\phi W20$ from the first magnetic flux $\phi W1$ detected by the first magnetic flux sensor unit 311 and the second magnetic flux $\phi W2$ detected by the second magnetic flux sensor unit 312 and transmits the magnetic source magnetic flux $\phi W20$ to the position detection unit 600. The following configuration is the same as that of the first embodiment.

Figure 13:
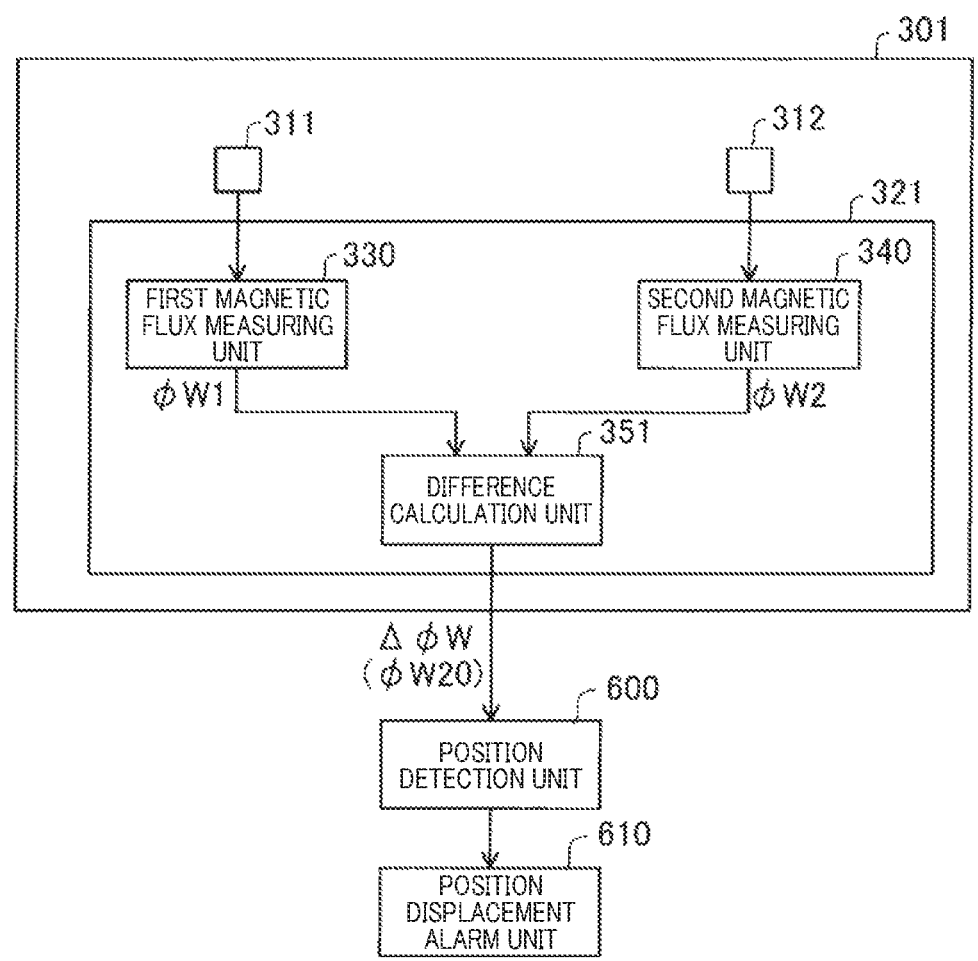
FIG. 13 is an explanatory drawing illustrating a configuration of a magnetic source detection device.

FIG. 13 is an explanatory drawing illustrating a configuration of the magnetic source detection device 301. The magnetic source detection device 301 includes the first magnetic flux sensor unit 311, the second magnetic flux sensor unit 312, and the signal processing unit 321. The signal processing unit 321 includes the first magnetic flux measuring unit 330, the second magnetic flux measuring unit 340, and a difference calculation unit 351. The signal Sa input to the first magnetic flux measuring unit 330 is for turning on the electronic switch SW2. The first magnetic flux measuring unit 330 may not include the electronic switch SW2. The difference calculation unit 351 determines which is larger the first magnetic flux $\phi W1$ or the second magnetic flux $\phi W2$, and acquires a difference between the first magnetic flux $\phi W1$ measured by the first magnetic flux measuring unit 330 and the second magnetic flux $\phi W2$ measured by the second magnetic flux measuring unit 340. Between the first magnetic flux $\phi W1$ and the second magnetic flux $\phi W2$, the larger $\phi Ws$ is the combination of the magnetic source magnetic flux $\phi W20$ and the transmission coil magnetic flux $\phi W40$, and the smaller $\phi Ws$ includes only the transmission coil magnetic flux $\phi W40$. Hence, the signal processing unit 321 calculates a difference $\Delta\phi W$ between the first magnetic flux $\phi W1$ and the second magnetic flux $\phi W2$, whereby the magnetic source magnetic flux $\phi W20$ can be acquired. For example, in a phase in which the first magnetic flux $\phi W1$ is positive, if the difference $\Delta\phi W$ is positive, the signal processing unit 321 can determine that the magnetic source magnetic flux $\phi W20$ is included in the first magnetic flux $\phi W1$, and if the difference $\Delta\phi W$ is negative, the signal processing unit 321 can determine that the magnetic source magnetic flux $\phi W20$ is included in the second magnetic flux $\phi W2$.

Figure 14:
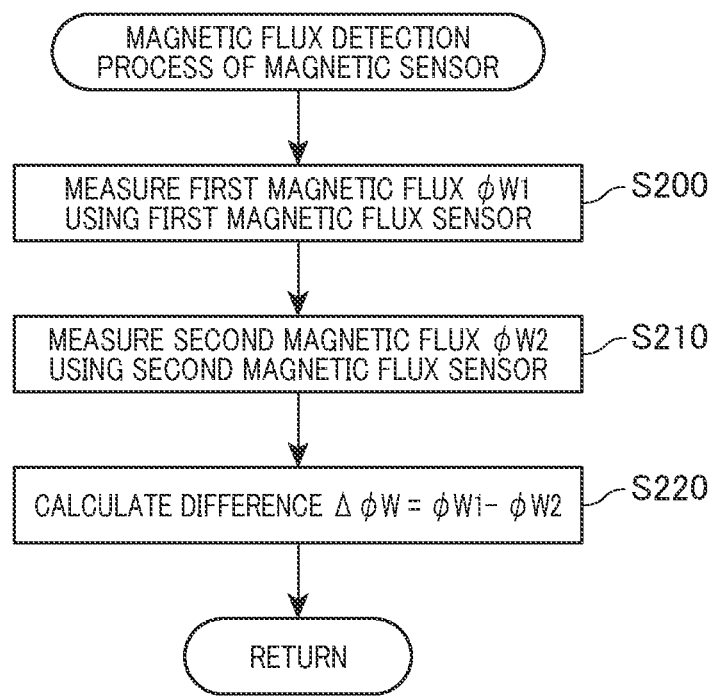
FIG. 14 is an explanatory drawing illustrating a magnetic flux detection processing step performed by a signal processing unit.

FIG. 14 is an explanatory drawing illustrating a magnetic flux detection processing step performed by the signal processing unit 321. In step S200, the signal processing unit 321 uses the first magnetic flux measuring unit 330 to measure the first magnetic flux $\phi W1$. In step S210, the signal processing unit 321 uses second magnetic flux measuring unit 340 to measure the second magnetic flux $\phi W2$. The signal processing unit 321 preferably performs step S200 and step S210 simultaneously, but may perform one of step S200 and step S210 earlier than the other. Although one of the first magnetic flux $\phi W1$ and the second magnetic flux $\phi W2$ includes the magnetic source magnetic flux $\phi W20$ in addition to transmission coil magnetic flux $\phi W40$, the other includes the transmission coil magnetic flux $\phi W40$ and does not include the magnetic source magnetic flux $\phi W20$.

In step S220, the signal processing unit 321 uses the difference calculation unit 351 to calculate the difference $\Delta\phi W$ between the first magnetic flux $\phi W1$ and the second magnetic flux $\phi W2$ and determines whether the magnetic source magnetic flux $\phi W20$ is included in the first magnetic flux $\phi W1$ or the second magnetic flux $\phi W2$.

Figure 15:
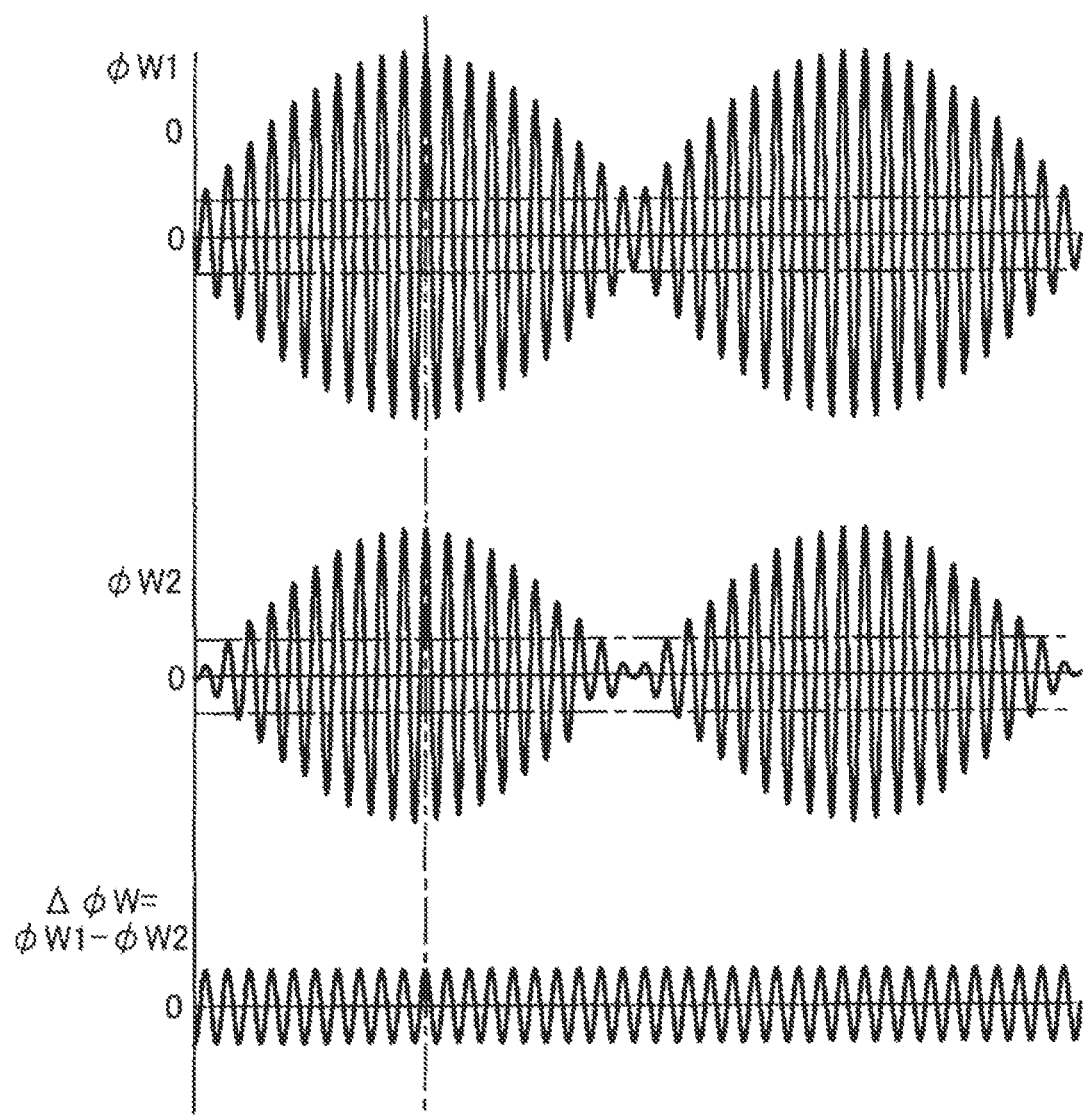
FIG. 15 is an explanatory drawing illustrating a first magnetic flux, a second magnetic flux, and a difference.

FIG. 15 is an explanatory drawing illustrating the first magnetic flux $\phi W1$, the second magnetic flux $\phi W2$, and the difference $\Delta\phi W$. Since the first magnetic flux $\phi W1$ includes the magnetic source magnetic flux φW20 and the transmission coil magnetic flux φW40, the first magnetic flux φW1 has an amplitude higher than that of the second magnetic flux φW2 that includes only the transmission coil magnetic flux φW40. The difference ΔφW between the first magnetic flux φW1 and the second magnetic flux φW2 has an approximately constant amplitude. Since when the first magnetic flux φW1 is positive, the difference ΔφW is also positive, it can be understood that the first magnetic flux φW1 includes the magnetic source magnetic flux φW20 and the transmission coil magnetic flux φW40.

As described above, according to the second embodiment, when the first magnetic flux sensor unit 311 can measure the total magnetic flux φWs obtained by combing the magnetic source magnetic flux φW20 and the power transmission coil magnetic flux φW40, since the second magnetic flux sensor unit 312 is disposed at a position at which the second magnetic flux sensor unit 312 cannot measure the magnetic source magnetic flux φW20 and can measure only the power transmission coil magnetic flux φW40, the signal processing unit 321 can detect the magnetic source magnetic flux φW20 by using the difference ΔφW between the first magnetic flux φW1 and the second magnetic flux φW2.

Third Embodiment

Figure 16:
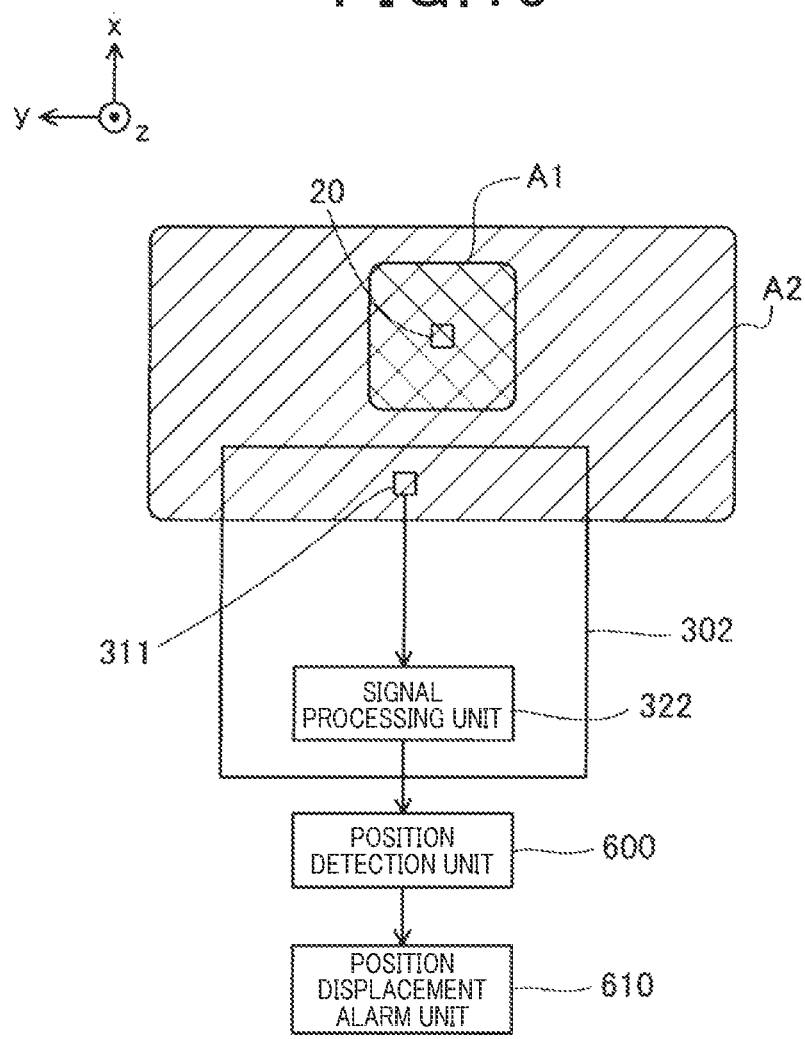
FIG. 16 is an explanatory drawing viewed from a vehicle illustrating an area which a magnetic source magnetic flux reaches, an area which a transmission coil magnetic flux reaches, and a first magnetic flux sensor unit, according to the third embodiment.
Figure 17:
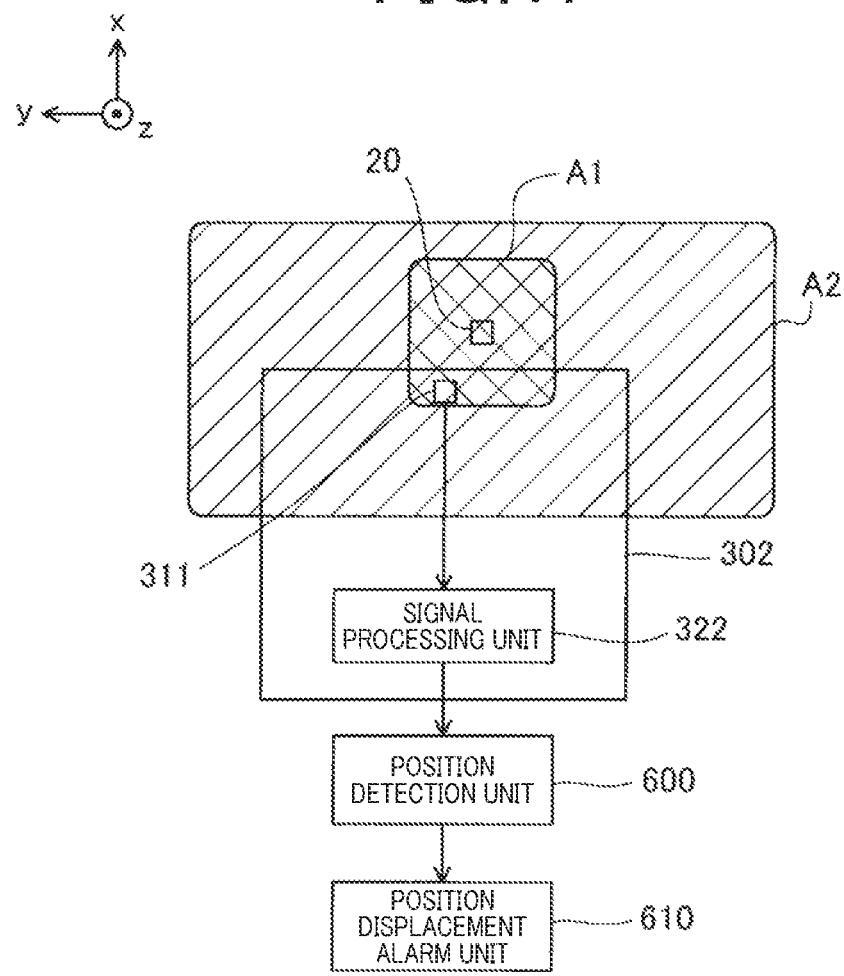
FIG. 17 is an explanatory drawing illustrating an area which a magnetic source magnetic flux reaches and an area which a transmission coil magnetic flux reaches after a certain time period has passed from the state in FIG. 16, and a first magnetic flux sensor unit.

FIG. 16 is an explanatory drawing viewed from the vehicle 202 illustrating the area A1 which the magnetic source magnetic flux φW20 reaches, the area A2 which the transmission coil magnetic flux φW40 reaches, and the first magnetic flux sensor unit 311 of a magnetic source detection device 302, according to the third embodiment. FIG. 17 is an explanatory drawing, which is viewed from the vehicle 202 after a certain time period has passed from the state in FIG. 16, illustrating the area A1 which the magnetic source magnetic flux φW20 reaches, the area A2 which the transmission coil magnetic flux φW40 reaches, and the first magnetic flux sensor unit 311 of the magnetic source detection device 302. In the third embodiment, the magnetic source detection device 302 includes the first magnetic flux sensor unit 311. However, the magnetic source detection device 302 differs from the above embodiments in that the magnetic source detection device 302 does not include the second magnetic flux sensor unit 312.

A signal processing unit 322 acquires the magnetic source magnetic flux φW20 from the first magnetic flux φW1 detected by the first magnetic flux sensor unit 311 and transmits the magnetic source magnetic flux φW20 to the position detection unit 600. The following configuration is similar to that of the first embodiment.

Figure 18:
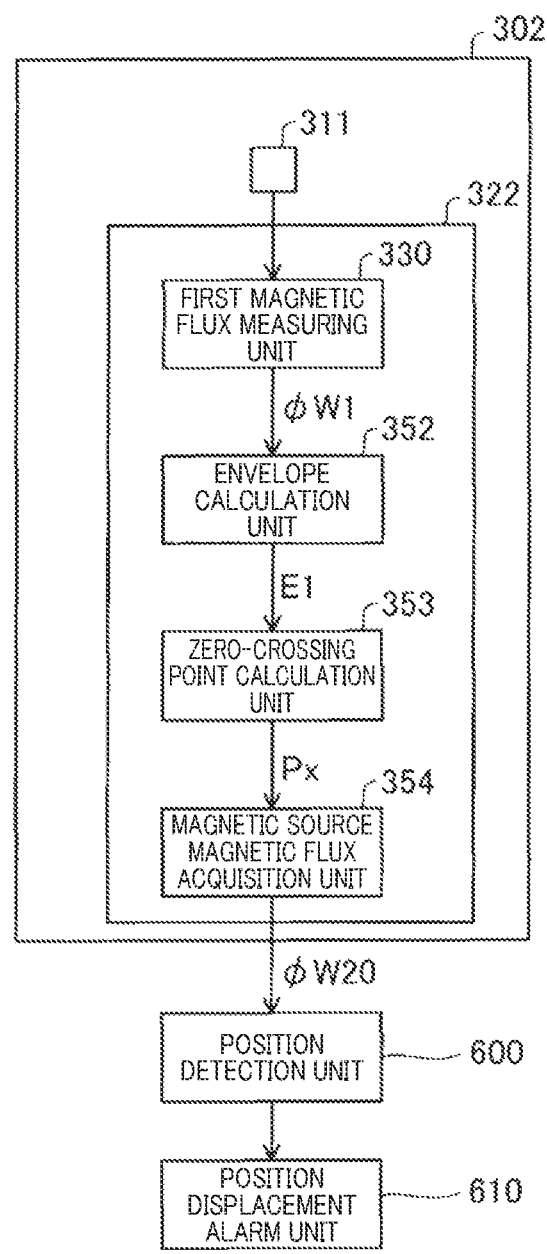
FIG. 18 is an explanatory drawing illustrating a configuration of a magnetic source detection device.

FIG. 18 is an explanatory drawing illustrating a configuration of the magnetic source detection device 302. The magnetic source detection device 302 includes the first magnetic flux sensor unit 311 and the signal processing unit 322. The signal processing unit 322 includes the first magnetic flux measuring unit 330, an envelope calculation unit 352, a zero-crossing point calculation unit 353, and a magnetic source magnetic flux acquisition unit 354. The envelope calculation unit 352 calculates an envelope E1 of the first magnetic flux φW1 measured by the first magnetic flux measuring unit 330. The zero-crossing point calculation unit 353 calculates a zero-crossing point of the envelope E1. The magnetic source magnetic flux acquisition unit 354 acquires the first magnetic flux φW1 in an area Z centered on the zero-crossing point of the envelope E1 and sets the first magnetic flux φW1 as the magnetic source magnetic flux φW20.

Figure 19:
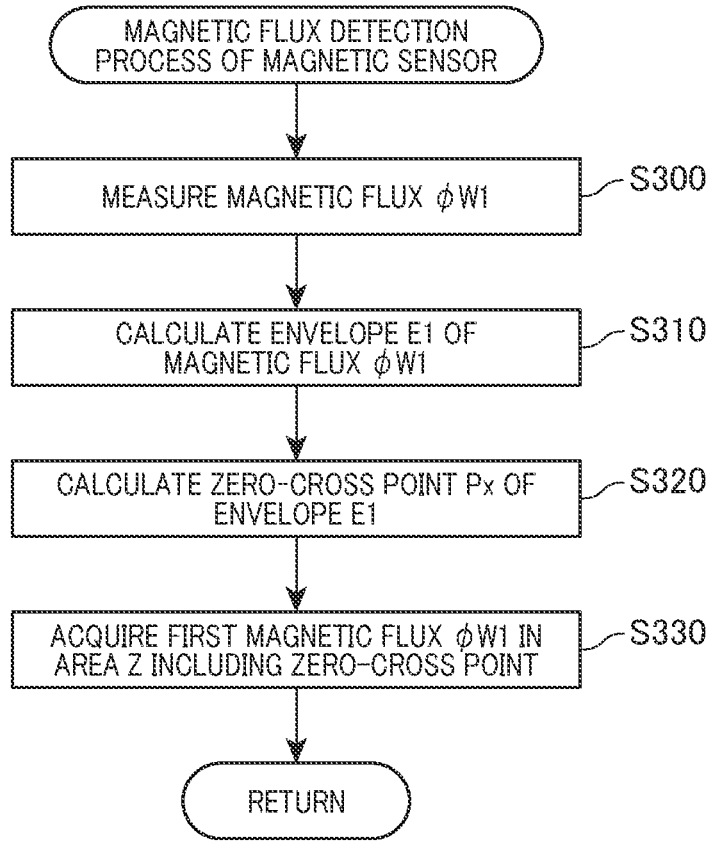
FIG. 19 is an explanatory drawing illustrating a magnetic flux detection processing step performed by the signal processing unit.

FIG. 19 is an explanatory drawing illustrating a magnetic flux detection processing step performed by the signal processing unit 322. In step S300, the signal processing unit 322 uses the first magnetic flux measuring unit 330 to measure the magnetic flux φW1. In step S310, the signal processing unit 322 uses the envelope calculation unit 352 to calculate the envelope E1 of the magnetic flux φW1. In step S320, the signal processing unit 322 uses the zero-crossing point calculation unit 353 to calculate a zero-crossing point Px of the envelope E1. In step S330, the signal processing unit 322 uses the magnetic source magnetic flux acquisition unit 354 to acquire the first magnetic flux φW1 in the area Z including the zero-crossing point Px as the magnetic source magnetic flux φW20.

Figure 20:
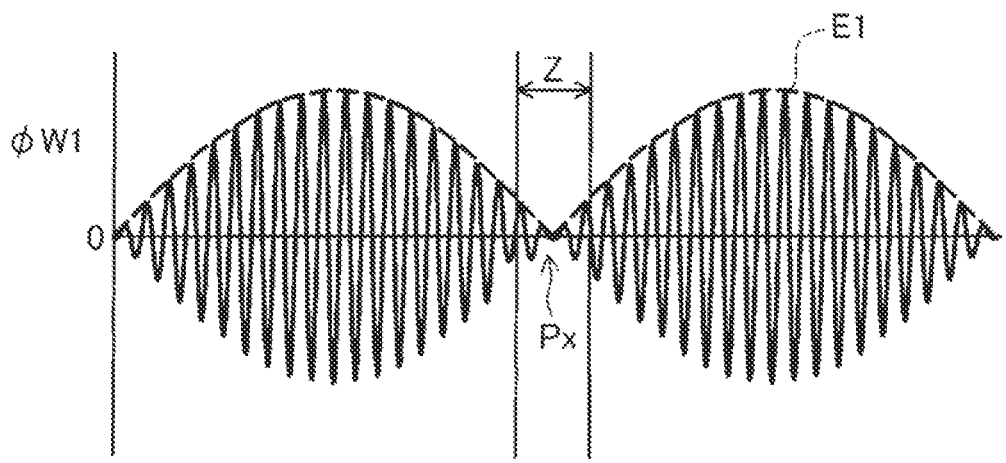
FIG. 20 is a drawing illustrating a first magnetic flux in a state in FIG. 16.

FIG. 20 illustrates the first magnetic flux φW1 in the state in FIG. 16. In the state in FIG. 16, since the first magnetic flux sensor unit 311 is not present in the area A1 which the magnetic source magnetic flux φW20 reaches, the first magnetic flux φW1 in the area Z including the zero-crossing point Px is substantially zero, and the magnetic source magnetic flux φW20 acquired in step S330 is also approximately zero.

Figure 21:
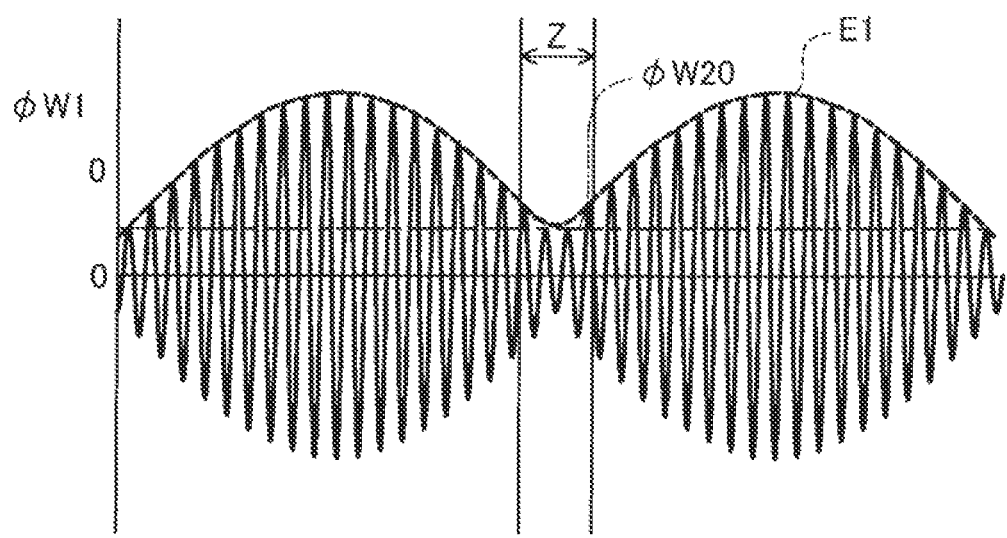
FIG. 21 is a drawing illustrating a first magnetic flux in a state in FIG. 17.

FIG. 21 illustrates the first magnetic flux φW1 in the state in FIG. 17. In the state in FIG. 17, since the first magnetic flux sensor unit 311 is present in the area A1 which the magnetic source magnetic flux φW20 reaches, the magnitude of the first magnetic flux φW1 in the area Z including the zero-crossing point Px is substantially the same as that of the magnetic source magnetic flux φW20.

As described above, according to the third embodiment, even in a configuration including only one first magnetic flux measuring unit 330, the magnetic source detection device 300 can acquire the magnetic source magnetic flux φW20 by using the first magnetic flux φW1 measured by the first magnetic flux measuring unit 330. Since the time period in which zero-crossing point arrives is determined by a frequency of the power transmission coil 40, if the frequency is fixed, measurement or signal processing can be prepared with predicting the time at which the next zero-point arrives. Even when the frequency changes based on the change in the resonant condition during power transmission and reception, the resonant condition gradually changes. Hence, without sudden change in the frequency, the measurement or signal processing can also be prepared with predicting a next zero-crossing time from the previous zero-crossing point time interval.

Fourth Embodiment

Figure 22:
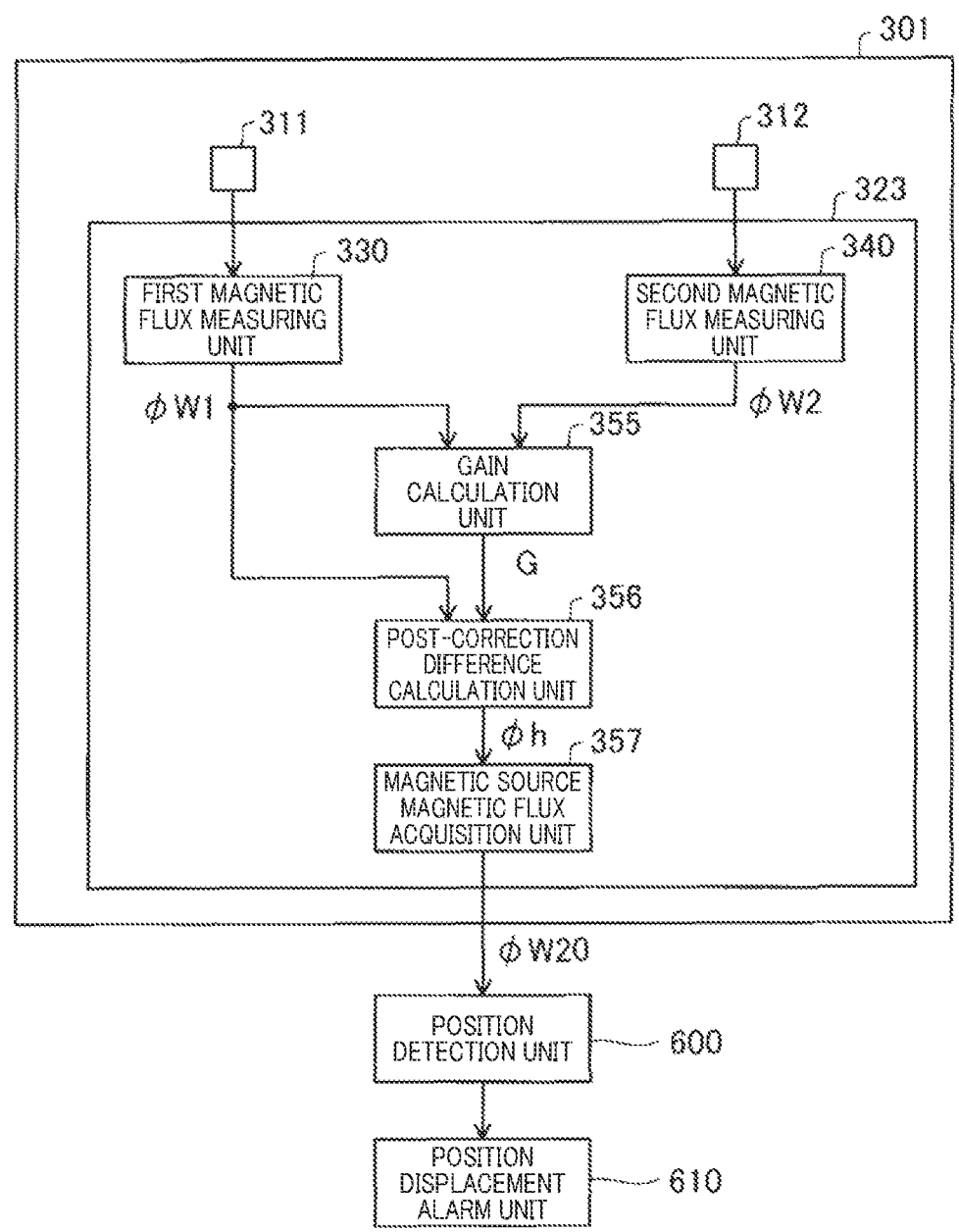
FIG. 22 is an explanatory drawing illustrating a configuration of a signal processing unit according to a fourth embodiment.

FIG. 22 is an explanatory drawing illustrating a configuration of the signal processing unit 323 according to the fourth embodiment. The signal processing unit 323 according to the fourth embodiment includes the first magnetic flux measuring unit 330, the second magnetic flux measuring unit 340, a gain calculation unit 355, a post-correction difference calculation unit 356, and a magnetic source magnetic flux acquisition unit 357. The gain calculation unit 355 uses the first magnetic flux φW1 measured by the first magnetic flux measuring unit 330 and the second magnetic flux φW2 generated by the second magnetic flux measuring unit 340 to calculate a gain G. The gain G is used to correct the difference between sensitivity of the first magnetic flux measuring unit 330 and sensitivity of the second magnetic flux measuring unit 340. The post-correction difference calculation unit 356 considers sensitivity of the first magnetic flux measuring unit 330 and the second magnetic flux measuring unit 340 to calculate a post-correction difference h between the first magnetic flux φW1 and the second magnetic flux φW2. The magnetic source magnetic flux acquisition unit 357 calculate and acquires the magnetic source magnetic flux φW20 from the post-correction difference h.

Figure 23:
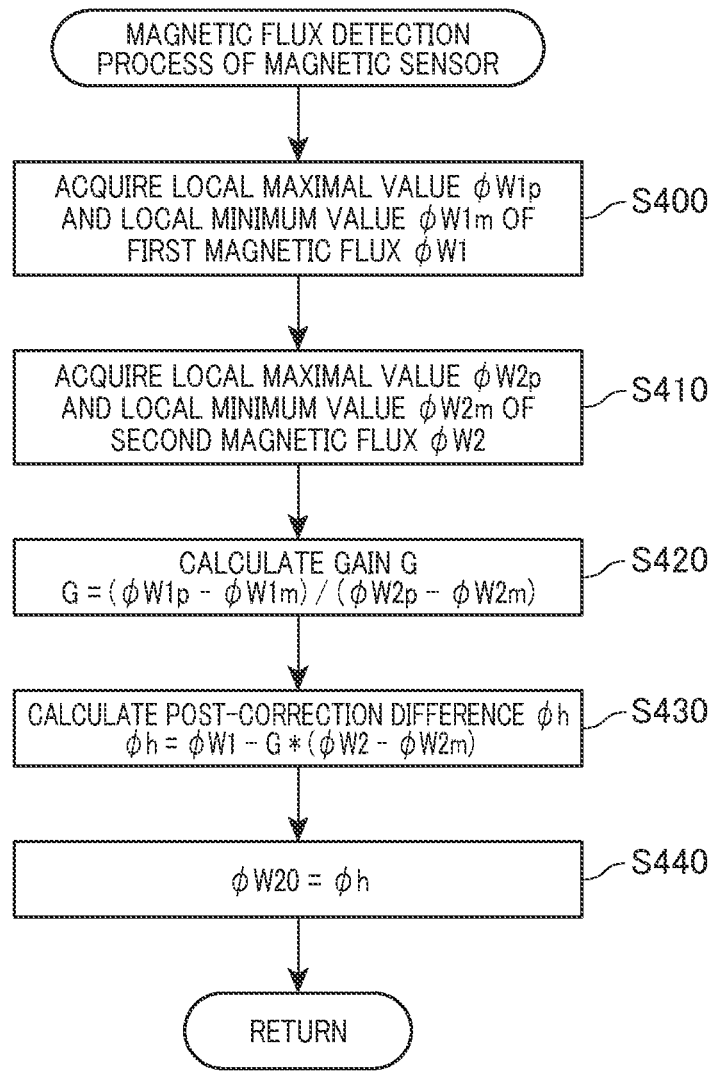
FIG. 23 is an explanatory drawing illustrating a magnetic flux detection processing step performed by the signal processing unit according to the fourth embodiment.
Figure 24:
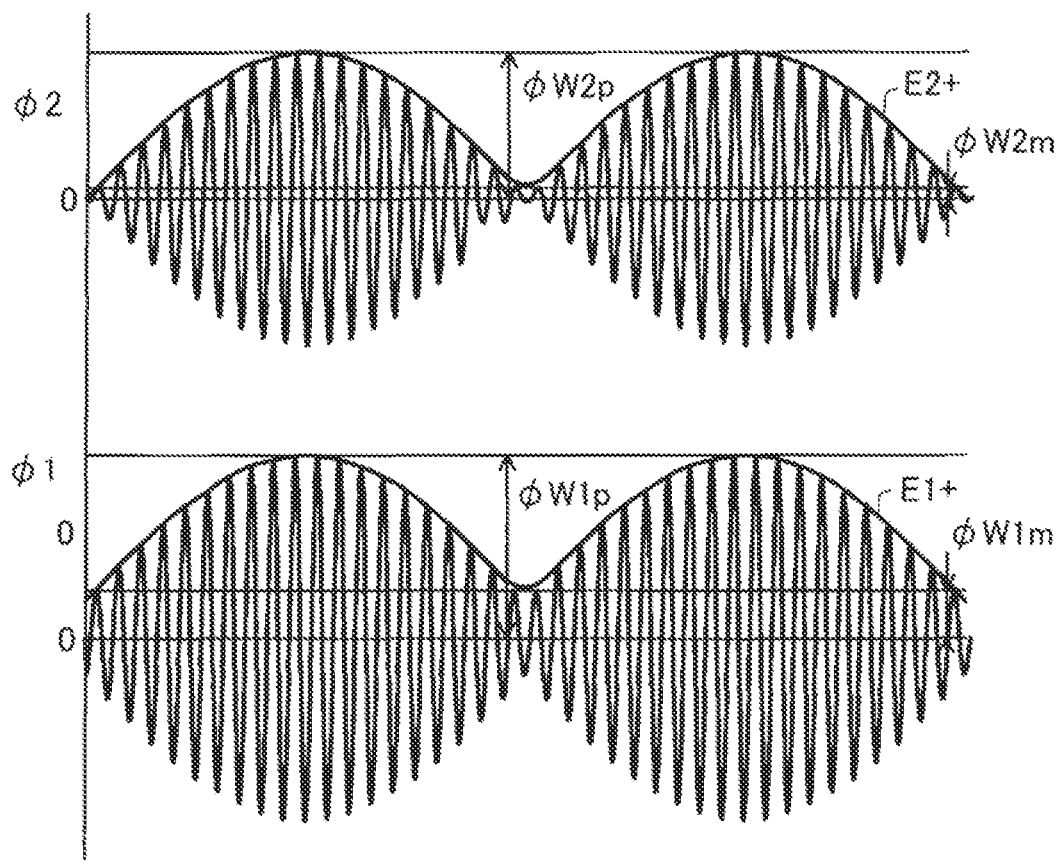
FIG. 24 is an explanatory drawing illustrating a first magnetic flux and a second magnetic flux according to the fourth embodiment.

FIG. 23 is an explanatory drawing illustrating a magnetic flux detection processing step performed by the signal processing unit 323 according to the fourth embodiment. In step S400, the gain calculation unit 355 of the signal processing unit 323 acquires a local maximal value φW1$p$ of the first magnetic flux φW1 measured by the first magnetic flux measuring unit 330 and a local minimum value φW1$m$, which is a first reference value. As illustrated in FIG. 24, the local maximal value φW1$p$ and the local minimum value φW1$m$ respectively correspond to a local maximal value and a local minimum value of the envelope E1+ on the positive side of the first magnetic flux φW1. The local minimum value φW1$m$ is a value obtained when the first magnetic flux measuring unit 330 does not detect the transmission coil magnetic flux φW40.

In step S410 in FIG. 23, the gain calculation unit 355 of the signal processing unit 323 acquires a local maximal value φW2$p$ of the second magnetic flux φW2 measured by the second magnetic flux measuring unit 340 and a local minimum value φW2$m$, which is a second reference value. As illustrated in FIG. 24, the local maximal value φW2$p$ and the local minimum value φW2$m$ respectively correspond to a local maximal value and a local minimum value of the envelope E2+ on the positive side of the second magnetic flux φW2. The local minimum value φW2$m$ is a value obtained when the second magnetic flux measuring unit 340 does not detect the magnetic source magnetic flux φW20 and the transmission coil magnetic flux φW40.

In step S420 in FIG. 23, the gain calculation unit 355 of the signal processing unit 323 calculate the gain G from the following expression to calculate the difference between the sensitivity of the first magnetic flux measuring unit 330 and the sensitivity of the second magnetic flux measuring unit 340. The sensitivity is for magnetic fluxes of the first magnetic flux measuring unit 330 and the second magnetic flux measuring unit 340. In addition, the sensitivity depends on a distance between the first magnetic flux sensor unit 311 and the magnetic source 20, a distance between the first magnetic flux sensor unit 311 and the power transmission coils 40, a distance between the second magnetic flux sensor unit 312 and the magnetic sources 20, and a distance between the second magnetic flux sensor unit 312 and the power transmission coils 40. The gain calculation unit 355 calculates the gain G by using average values obtained by measuring the local maximal value φW1$p$, the local minimum value φW1$m$, the local maximal value φW2$p$, and the local minimum value φW2$m$ by the first magnetic flux measuring unit 330 and the second magnetic flux measuring unit 340, for example, ten times. The gain calculation unit 355 may use an average value of measurement results of the local maximal value φW1$p$, the local minimum value φW1$m$, the local maximal value φW2$p$, and the local minimum value φW2$m$ measured by the first magnetic flux measuring unit 330 and the second magnetic flux measuring unit 340, any of two to fifteen times.

$$G=(\phi W1p-\phi W1m)/(\phi W2p-\phi W2m)$$

In step S430, the post-correction difference calculation unit 356 of the signal processing unit 323 calculates the post-correction difference φh considering sensitivity of the first magnetic flux measuring unit 330 and sensitivity of the second magnetic flux measuring unit 340 from the following expression.

$$\phi h=\phi W1-G*(\phi W2-\phi W2m)$$

In step S440, the magnetic source magnetic flux acquisition unit 357 acquires the post-correction difference h as the magnetic source magnetic flux φW20.

As described above, according to the fourth embodiment, the signal processing unit 323 calculates the difference between sensitivity of the first magnetic flux measuring unit 330 and sensitivity of the second magnetic flux measuring unit 340 as a gain, whereby the magnetic source magnetic flux φW20 can be acquired. In addition, considering the distance between the first magnetic flux sensor unit 311 and the magnetic source 20, the distance between the first magnetic flux sensor unit 311 and the power transmission coils 40, the distance between the second magnetic flux sensor unit 312 and the magnetic source 20, and the distance between the second magnetic flux sensor unit 312 and the power transmission coil 40, the signal processing unit 323 can acquire the magnetic source magnetic flux φW20.

Fifth Embodiment

Figure 25:
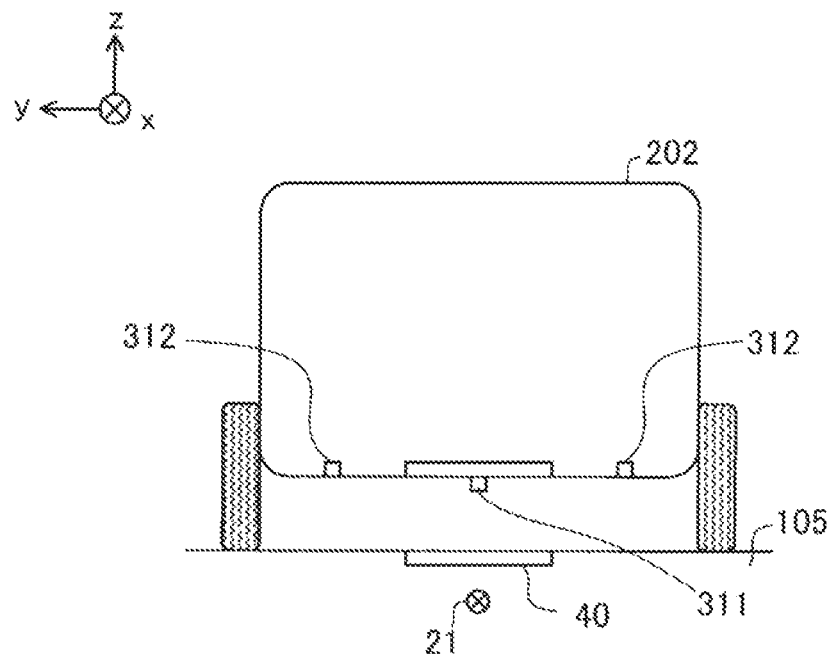
FIG. 25 is an explanatory drawing illustrating a magnetic source and a vehicle according to a fifth embodiment.
Figure 26:
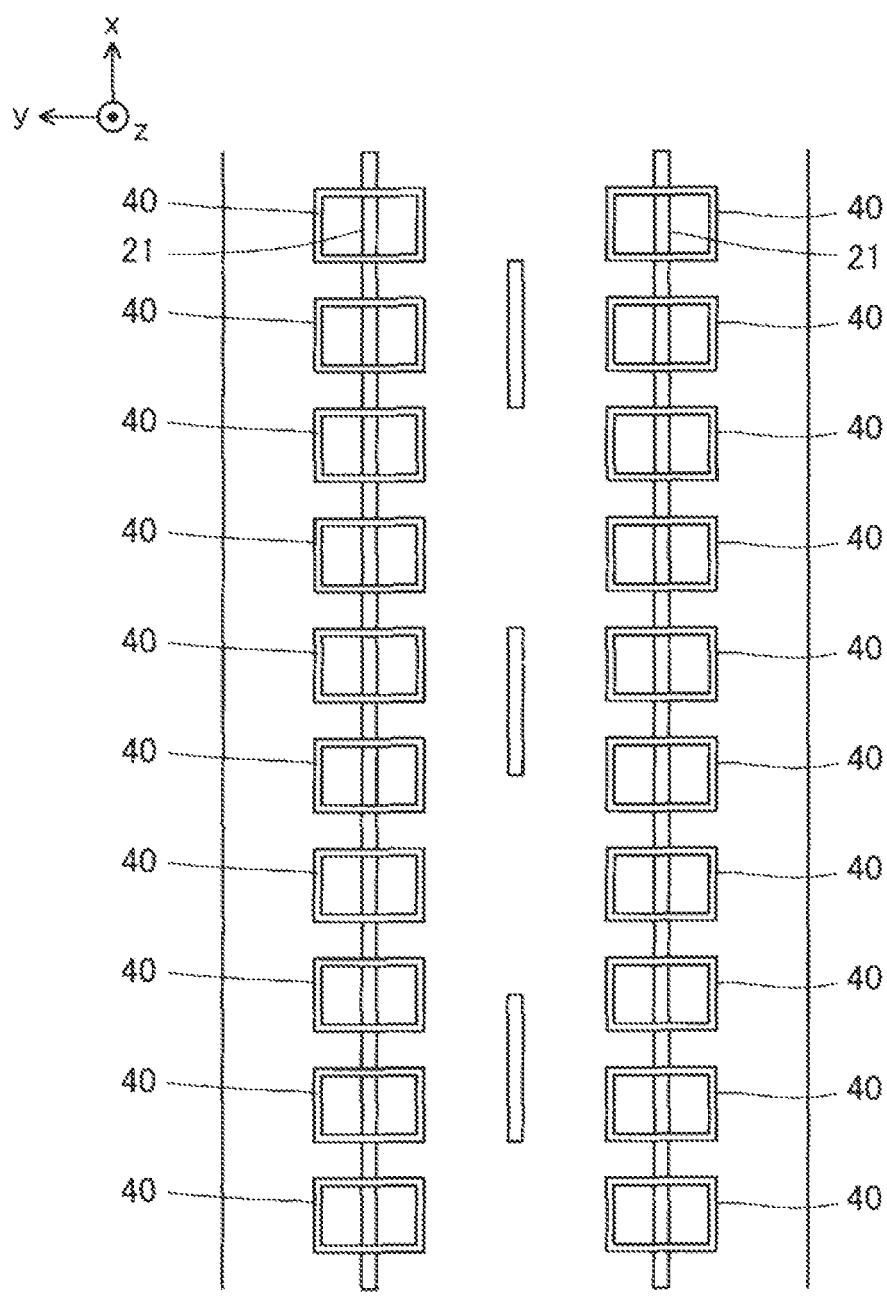
FIG. 26 is an explanatory drawing illustrating power transmission coils and magnetic sources buried in a road.

FIG. 25 is an explanatory drawing illustrating magnetic sources 21 and the vehicle 202 according to the fifth embodiment. FIG. 26 is an explanatory drawing illustrating the power transmission coils 40 and the magnetic sources 21 buried in the road 105. In the first to fourth embodiments, the magnetic sources 20 are formed of point-like magnets buried in the road 105. However, the magnetic source 21 of the fifth embodiment has a linear shape along the traveling direction of the road 105, and is formed of, for example, electrical wires. That is, flowing current to the wires generates a magnetic field around a wire, and a magnetic flux is generated. The magnetic flux is used as a magnetic source magnetic flux. In the fifth embodiment, the magnetic source 21 is formed of a wire. However, for example, the magnetic source 21 may be formed of a magnetic tape. Similarly, the magnetic source detection device 300 can detect and measure a magnetic flux of the magnetic source 21.

As described above, according to the fifth embodiment, the magnetic source 21 buried in the road 105 may be a magnetic source having a linear shape along the traveling direction of the road 105.

In the fifth embodiment, a magnetic source magnetic flux φW201 may be measured at the first timing, and thereafter, a magnetic source magnetic flux φW202 may be measured at a second timing after the vehicle 202 is moved, for example, in +y direction. In this case, if the magnetic source magnetic flux φW202 is larger than the magnetic source magnetic flux φW201, it can be said that the vehicle 202 has approached the magnetic source 20 due to the movement of the vehicle 202 in +y direction. In contrast, if the magnetic source magnetic flux φW202 is smaller than the magnetic source magnetic flux φW201, it can be said that the vehicle 202 has gone away from the magnetic source 20 due to the movement of the vehicle 202 in +y direction. Hence, measuring the magnetic source magnetic flux φW201 at the two timings before and after the movement in the y direction and comparing the magnitudes thereof, it can be determined whether the vehicle 202 has moved so as to approach the magnetic source 20 or recede from the magnetic source 20. Hence, the position detection unit 600 can detect the position of the vehicle 202 with respect to the magnetic source 20 by using magnetic fluxes at the two timings and movement of the vehicle 202 between the two timings.

In the fifth embodiment, in the magnetic source detection device 300, the first magnetic flux sensor unit 311 and the second magnetic flux sensor unit 312 are installed. However, the second magnetic flux sensor unit 312 can be separated from the magnetic source detection device 300 or can share a signal of the second magnetic flux sensor unit 312 with the first magnetic flux sensor unit 311 in such a manner that the signal is used in the first magnetic flux sensor unit 311.

Sixth Embodiment

Figure 27:
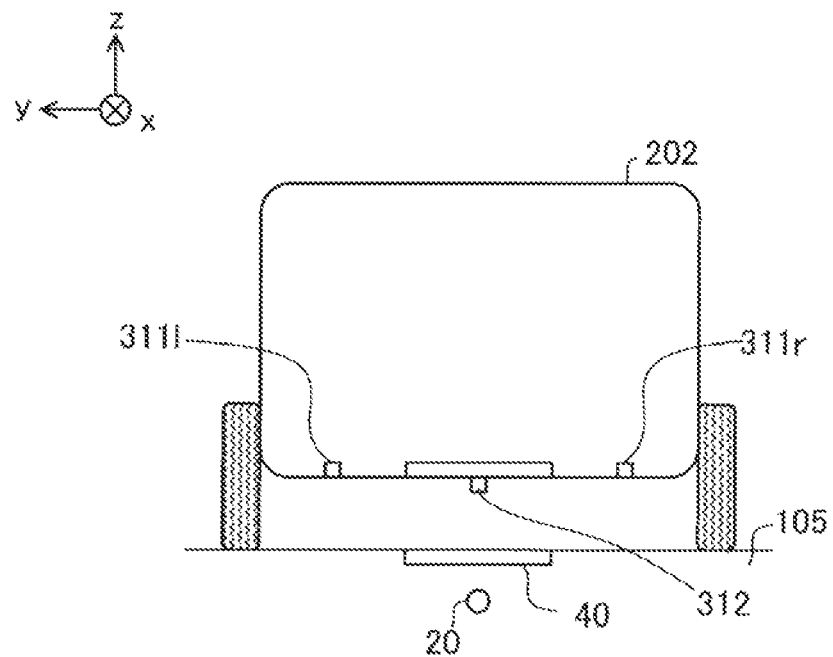
FIG. 27 is an explanatory drawing illustrating magnetic sources and a vehicle according to a sixth embodiment.

FIG. 27 is an explanatory drawing illustrating the magnetic source 20 and the vehicle 202 according to the sixth embodiment. In the fifth embodiment, the vehicle 202 includes one first magnetic flux sensor unit 311. However, the sixth embodiment differs from the fifth embodiment in that the vehicle 202 includes a right first magnetic flux sensor unit 311r and a left first magnetic flux sensor unit 311l at different positions in the width direction (y direction) of the vehicle 202.

Figure 28:
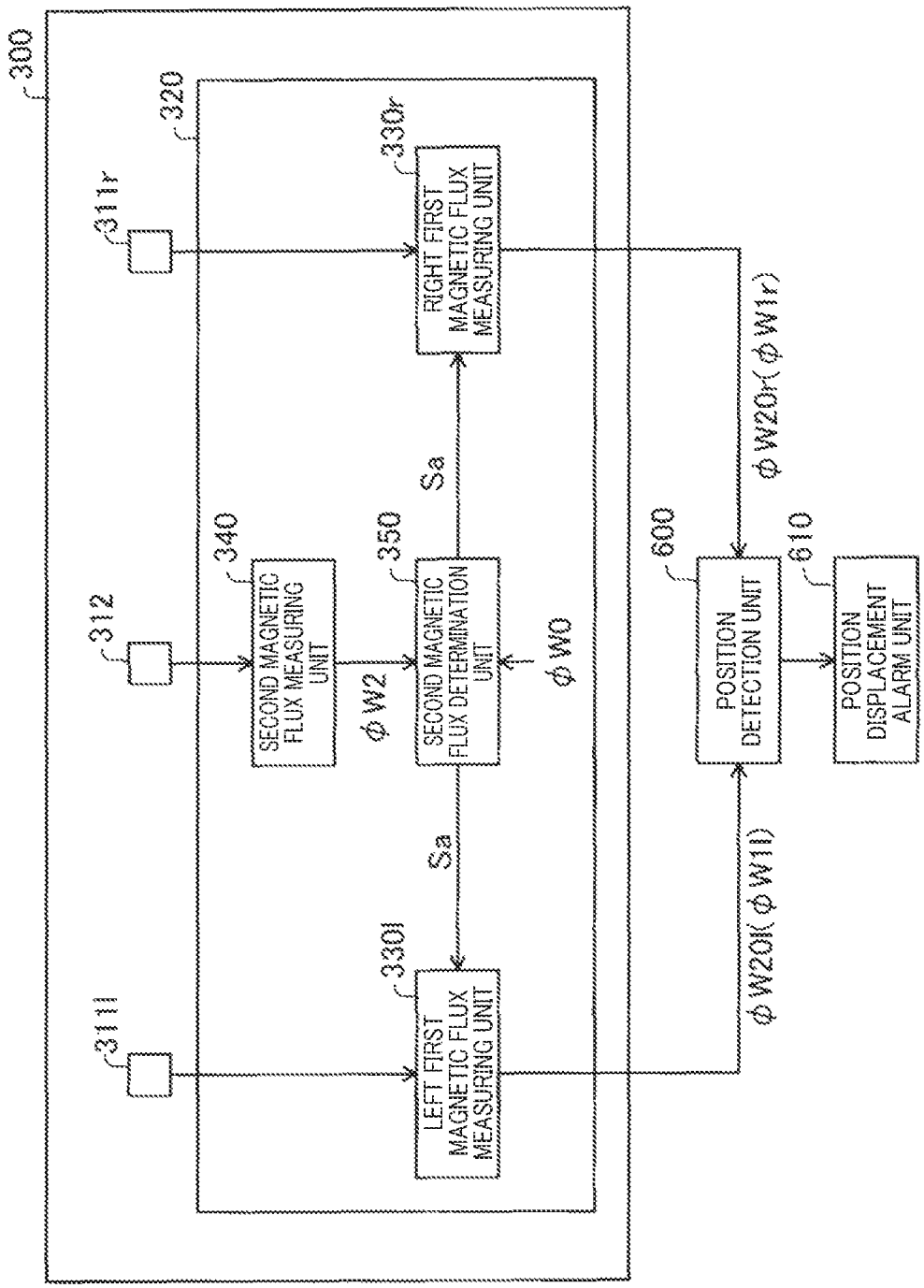
FIG. 28 is an explanatory drawing illustrating a magnetic source detection device according to the sixth embodiment.

FIG. 28 is an explanatory drawing illustrating the magnetic source detection device 300 according to the sixth embodiment. The magnetic source detection device 300 includes magnetic flux sensor units 311r, 311l, 312 and the signal processing unit 320. The signal processing unit 320 includes a right first magnetic flux measuring unit 330r, a left first magnetic flux measuring unit 330l, the second magnetic flux measuring unit 340, and the second magnetic flux determination unit 350. The right first magnetic flux measuring unit 330r measures a first magnetic flux $\phi W1r$ received by the right first magnetic flux measuring unit 330r. The left first magnetic flux measuring unit 330l measures a first magnetic flux $\phi W1r$ received by the left first magnetic flux sensor unit 311l. As described later, the two first magnetic flux measuring units 330r, 330l measure the first magnetic flux $\phi W1r$, $\phi W1l$ only when the two first magnetic flux measuring units 330r, 330l are activated by the signal Sa and become operable. The second magnetic flux measuring unit 340 measures the second magnetic flux $\phi W2$ received by the second magnetic flux sensor unit 312. The second magnetic flux determination unit 350 transmits the signal Sa to the two first magnetic flux measuring units 330r, 330l depending on the magnitude of the second magnetic flux $\phi W2$. In the present embodiment, if the second magnetic flux $\phi W2$ is a predetermined threshold value $\phi W0$ or less, the signal Sa transmitted by the second magnetic flux determination unit 350 operates the two first magnetic flux measuring units 330r, 330l. If the second magnetic flux $\phi W2$ is more than the predetermined threshold value, the signal Sa stops the operation of the two first magnetic flux measuring units 330r, 330l. In the present embodiment, the first magnetic fluxes $\phi W1r$, $\phi W1l$ measured by the two first magnetic flux sensor units 311r, 311l are obtained when the second magnetic flux $\phi W2$ is small, that is, the transmission coil magnetic flux $\phi W40$ is small. Hence, the first magnetic fluxes $\phi W1r$, $\phi W1l$ are approximately the same as the magnetic source magnetic flux $\phi W20$.

When the difference between the two first magnetic fluxes $\phi W1r$ and $\phi W1l$ measured by the two first magnetic sensor units 311r, 311l is minimum, the magnetic sources 20 is Intermediate between the two first magnetic sensor units 311r and 311l. When the first magnetic flux $\phi W1r$ is larger than the first magnetic flux $\phi W1l$, it can be said that the magnetic source 20 is at a position closer to the first magnetic sensor unit 311r than to the first magnetic sensor unit 311l, and the vehicle 202 is displaced in +y direction with respect to the magnetic source 20. In contrast, when the first magnetic flux $\phi W1l$ is larger than the first magnetic flux $\phi W1r$, it can be said that the magnetic source 20 is at a position closer to the first magnetic sensor unit 311l than to the first magnetic sensor unit 311r, and the vehicle 202 is displaced in −y direction with respect to the magnetic source 20. The position detection unit 600 compares the magnitudes of the first magnetic flux $\phi W1r$ and the first magnetic flux $\phi W1l$, whereby the detection unit 600 can determine whether the vehicle 202 is on the magnetic source 20 or is displaced in +y direction or −y direction with respect to the magnetic source 20.

Seventh Embodiment

Figure 29:
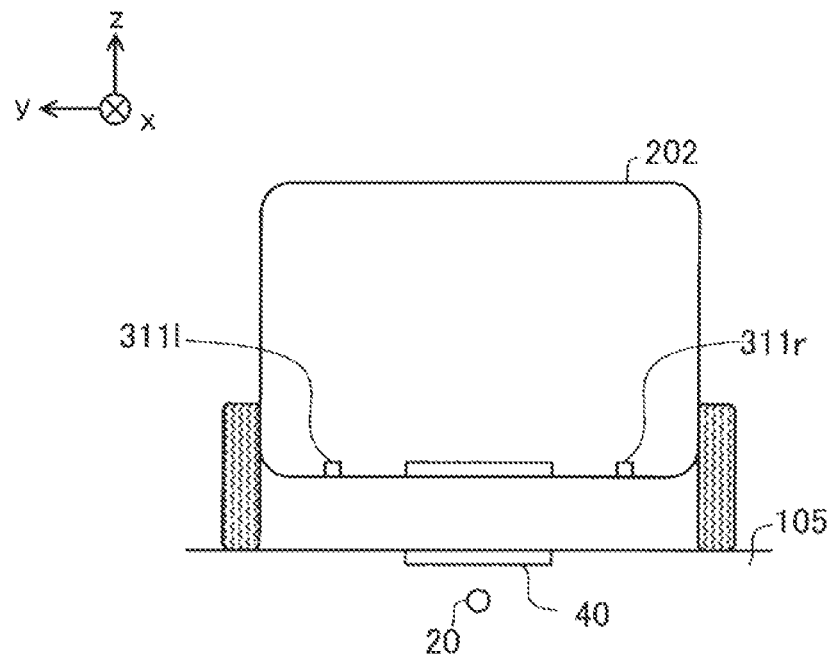
FIG. 29 is an explanatory drawing illustrating a magnetic source and a vehicle according to a seventh embodiment.

FIG. 29 is an explanatory drawing illustrating the magnetic sources 20 and the vehicle 202 according to the seventh embodiment. The seventh embodiment differs from the above embodiments in that the vehicle 202 does not include the second magnetic flux sensor unit 312. In the seventh embodiment, the two first magnetic flux measuring unit 330r, 330l are activated and measure the first magnetic fluxes $\phi W1r$, $\phi W1l$. Since it can be considered that the first magnetic fluxes $\phi W1r$, $\phi W1l$ include the transmission coil magnetic flux $\phi W40$ equivalently, obtaining the difference between the first magnetic fluxes $\phi W1r$ and $\phi W1l$ can cancel the transmission coil magnetic flux $\phi W40$. Hence, even in the seventh embodiment, as in the sixth embodiment, when the difference between the two first magnetic fluxes $\phi W1r$ and $W1l$ measured by the two first magnetic sensor units 311r, 311l is minimum, the magnetic sources 20 is approximately intermediate between the two first magnetic sensor units 311r and 311l. When the first magnetic flux $\phi W1r$ is larger than the first magnetic flux $\phi W1l$, it can be said that the magnetic source 20 is at a position closer to the first magnetic sensor unit 311r than to the first magnetic sensor unit 311l, and the vehicle 202 is displaced in +y direction with respect to the magnetic source 20. In contrast, when the first magnetic flux $\phi W1$ is larger than the first magnetic flux $\phi W1r$, it can be said that the magnetic source 20 is at a position closer to the first magnetic sensor unit 311l than to the first magnetic sensor unit 311r, and the vehicle 202 is displaced in −y direction with respect to the magnetic source 20. The position detection unit 600 compares the magnitudes of the first magnetic flux $\phi W1r$ and the first magnetic flux $\phi W1l$, whereby the detection unit 600 can determine whether the vehicle 202 is on the magnetic source 20 or is displaced in +y direction or −y direction with respect to the magnetic source 20.

Figure 30:
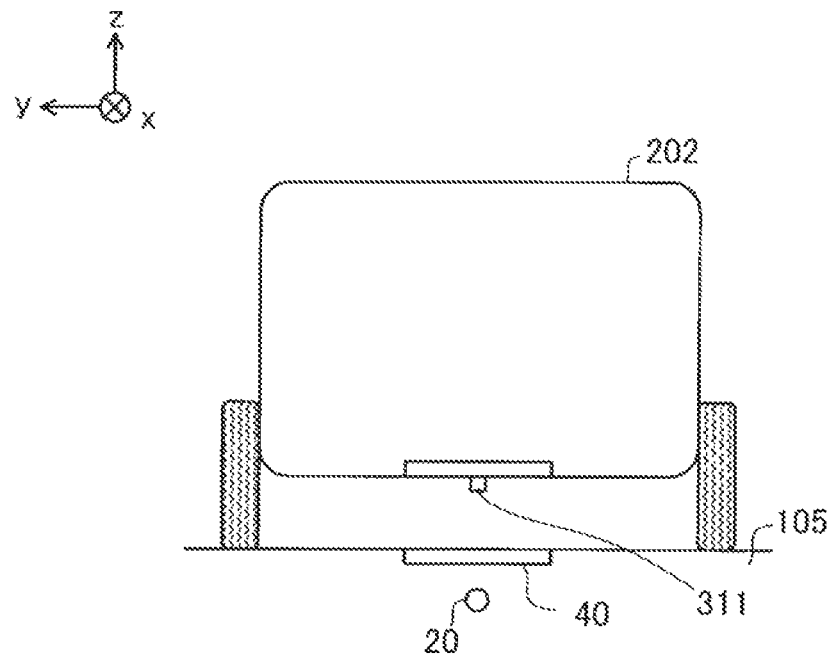
FIG. 30 is an embodiment including only one first magnetic sensor unit.

FIG. 30 is an embodiment including only one first magnetic sensor unit 311. As in the fifth embodiment, the magnetic source magnetic flux $\phi W201$ is measured at the first timing, and thereafter, the magnetic source magnetic flux $\phi W202$ is measured at a second timing after the vehicle 202 is moved, for example, in +y direction. In this case, if the magnetic source magnetic flux $\phi W202$ is larger than the magnetic source magnetic flux $\phi W201$, it can be said that the vehicle 202 has approached the magnetic source 20 due to the movement of the vehicle 202 in +y direction. In contrast, if the magnetic source magnetic flux $\phi W202$ is smaller than the magnetic source magnetic flux $\phi W201$, it can be said that the vehicle 202 has gone away from the magnetic source 20 due to the movement of the vehicle 202 in +y direction. Hence, measuring the magnetic source magnetic flux $\phi W201$ at the two timings, before and after the movement in y direction and comparing the magnitudes thereof, it can be determined whether the vehicle 202 has moved so as to approach the magnetic source 20 or recede from the magnetic source 20. Hence, the position detection unit 600 can detect the position of the vehicle 202 with respect to the magnetic source 20 by using magnetic fluxes at the two timings and movement of the vehicle 202 between the two timings.

In the above sixth to eight embodiments, the magnetic source 20 is used. However, as in the fifth embodiment, the magnetic source 21 having a linear shape along the traveling direction of the road 105 may be used.

In the above embodiment, the power transmission coils 40 are buried in the road 105. However, the power transmission coils 40 may be buried in, in addition to the road 105, a place where the vehicle 202 travels, or the vehicle 202 can be parked or stopped, such as the ground of a parking area.

The present disclosure is not limited to the above-described embodiments and can be implemented with various configurations within a scope not deviating from the gist of the present disclosure. For example, technical features in the embodiments can be appropriately replaced or combined with each other in order to solve all or part of the objects described above or to achieve all or part of the effects described above. Some of the technical features can be appropriately deleted if they are not described as essentials herein.

According to an embodiment of the present disclosure, a magnetic detection system is provided which is usable in a movable body (202) including a power receiving system (200) that receives power from a power transmission system (100) by electromagnetic induction. The magnetic detection system includes at least one magnetic flux measuring unit (311) that detects a magnetic flux including a magnetic source magnetic flux ($\phi$W20) from a magnetic source (20) disposed on the ground (105); a signal processing unit (320 to 323) that suppresses influence of a magnetic flux generated from the power receiving system on the magnetic flux measured by the magnetic flux sensor unit, to detect the magnetic source magnetic flux. According to this embodiment, a magnetic flux can be detected even in a state where a wireless charging system is operating.

What is claimed is:

1. A magnetic detection system that is usable in a movable body including a power receiving system that receives power from a power transmission system by electromagnetic induction, the magnetic detection system comprising:
    at least one magnetic flux measuring unit that detects a magnetic flux including a magnetic source magnetic flux from a magnetic source disposed on the ground; and
    a signal processing unit that suppresses influence of a magnetic flux generated from the power receiving system on the magnetic flux measured by the magnetic flux sensor unit, to detect the magnetic source magnetic flux.

2. The magnetic detection system according to claim 1, wherein
    when the magnetic flux measuring unit is set as a first magnetic flux measuring unit, and a magnetic flux including the magnetic source magnetic flux measured by the magnetic flux measuring unit is set as a first magnetic flux, the first magnetic flux includes the magnetic source magnetic flux and a transmission coil magnetic flux generated when the power transmission system transmits the power, and
    the magnetic detection system further includes a second magnetic flux measuring unit that measures the transmission coil magnetic flux, wherein
    the signal processing unit uses a second magnetic flux measured by the second magnetic flux measuring unit to control operation of the first magnetic flux measuring unit or correct the first magnetic flux.

3. The magnetic detection system according to claim 2, wherein
    the signal processing unit operates the first magnetic flux measuring unit during a time period in which the second magnetic flux is less than a predetermined value and stops the operation of the first magnetic flux measuring unit during a time period in which the second magnetic flux is the predetermined value or more, to detect the magnetic source magnetic flux.

4. The magnetic detection system according to claim 3, wherein
    the signal processing unit calculates a zero-crossing point at which the second magnetic flux zero-crosses and sets a time period of a predetermined area centering on the zero-crossing point as a time period in which the second magnetic flux is less than a predetermined value.

5. The magnetic detection system according to claim 2, wherein
    when the first magnetic flux measuring unit is capable of measuring the magnetic source magnetic flux and the transmission coil magnetic flux, the second magnetic flux measuring unit is disposed at a position at which the second magnetic flux measuring unit is not capable of measuring the magnetic source magnetic flux and is capable of measuring only the transmission coil magnetic flux, and
    the signal processing unit uses a difference between the first magnetic flux and the second magnetic flux to calculate the magnetic source flux.

6. The magnetic detection system according to claim 5, wherein
    the signal processing unit uses a local maximal value of the first magnetic flux, a first reference value obtained when the first magnetic flux measuring unit does not detect the transmission coil magnetic flux, a local maximal value of the second magnetic flux, and a second reference value obtained when the second magnetic flux measuring unit does not detect any of the transmission coil magnetic flux and the magnetic source magnetic flux to correct sensitivity of the first magnetic flux measuring unit and the second magnetic flux measuring unit, and uses a difference between the first magnetic flux and the second magnetic flux obtained after the correction, to calculate the magnetic source magnetic flux.

7. The magnetic detection system according to claim 1, wherein
    the at least one magnetic flux measuring unit includes two magnetic flux measuring units,
    the two magnetic flux measuring units are provided at different positions in the width direction of the movable body;
    the signal processing unit calculates displacement of the movable body in a width direction with respect to the magnetic source, from the difference of the magnetic fluxes measured by the two magnetic flux measuring units.

8. The magnetic detection system according to claim 7, wherein any of the two magnetic flux measuring units measures the magnetic source magnetic flux and a transmission coil magnetic flux that the power transmission system generates when transmitting the power.

9. The magnetic detection system according to claim 1, wherein
the signal processing unit uses a magnetic flux that the magnetic flux measuring unit has measured at first timing, a magnetic flux that the magnetic flux measuring unit has measured at second timing, and movement of the movable body from the first timing to the second timing, to calculate a position of the movable body in a width direction with respect to the magnetic source.

\* \* \* \* \*